United States Patent
Kitazawa et al.

(10) Patent No.: US 7,049,847 B2
(45) Date of Patent: May 23, 2006

(54) SEMICONDUCTOR DEVICE

(75) Inventors: Motoyasu Kitazawa, Kanagawa (JP);
Yasufumi Suzuki, Kanagawa (JP);
Yasuhiro Tomita, Kanagawa (JP)

(73) Assignee: NEC Electronics Corporation,
Kanagawa (JP)

( * ) Notice: Subject to any disclaimer, the term of this patent is extended or adjusted under 35 U.S.C. 154(b) by 0 days.

(21) Appl. No.: 10/829,234

(22) Filed: Apr. 22, 2004

(65) Prior Publication Data

US 2004/0212398 A1 Oct. 28, 2004

(30) Foreign Application Priority Data

Apr. 25, 2003 (JP) .............................. 2003-121480

(51) Int. Cl.
*H03K 19/02* (2006.01)
(52) U.S. Cl. .................... 326/56; 326/57; 326/58; 326/82
(58) Field of Classification Search ............ 326/56–58, 326/68, 80–83; 327/108, 109, 112
See application file for complete search history.

(56) References Cited

U.S. PATENT DOCUMENTS

| 5,118,974 | A |   | 6/1992 | Yarbrough et al. |
| 5,489,859 | A |   | 2/1996 | Kawaguchi et al. |
| 5,933,025 | A |   | 8/1999 | Nance et al. |
| 6,731,134 | B1 | * | 5/2004 | Bucossi et al. ............... 326/56 |

| 2002/0145445 | A1 | 10/2002 | Iizuka |

FOREIGN PATENT DOCUMENTS

| JP | 07-066710   | 3/1995 |
| JP | 9-064718    | 3/1997 |
| JP | 9-238065    | 9/1997 |
| JP | 10-163852   | 6/1998 |
| JP | 10-276081   | 10/1998 |
| JP | 11-317652   | 11/1999 |
| JP | 2001-313559 | 11/2001 |

OTHER PUBLICATIONS

Japanese Offices Action dated Aug. 30, 2005 (with partial English translation).

* cited by examiner

*Primary Examiner*—Anh Q. Tran
(74) *Attorney, Agent, or Firm*—McGinn IP Law Group, PLLC

(57) ABSTRACT

A semiconductor device including a tristate buffer circuit, which includes, on an output stage, at least a first transistor (P1) for pull-up driving and a second transistor (N1) for pull-down driving, in which, when a control signal (EN) is of a value indicating an enable state, an output is set to a high level or to a low level, depending on a data signal, and in which, when the control signal is of a value indicating a disable state, the first and second transistors are turned off to set a high impedance state of the output. The semiconductor device further includes a control unit (120, P6, P7) for performing control for speeding up the transition from the on-state to the off-state of the first transistor (P1) at the time of switching the control signal (EN) from the enable state to the disable state.

33 Claims, 15 Drawing Sheets

SEMICONDUCTOR DEVICE

FIELD OF THE INVENTION

This invention relates to a semiconductor device and, more particularly, to a mixed voltage circuit capable of coping with a plurality of sorts of power supply voltages.

BACKGROUND OF THE INVENTION

In a semiconductor device or an electronic device, adapted to have interfaces with plural sorts of power supply systems, each having different voltages, a tolerant buffer circuit, also termed an overvoltage tolerant buffer circuit or a mixed voltage circuit, is used, in which a terminal (pad) connected to an output of a tristate buffer circuit driven at a relatively low power supply voltage, can be connected to a terminal (pad) of a circuit, driven at a relatively high power supply voltage. For example, if an output of a tristate output buffer of a semiconductor device, driven by for example a 3 V-power supply, is connected to a bus of a system driven by a 5 V-power supply, a p-channel MOS transistor and an n-channel MOS transistor, forming an output stage of the tristate output buffer, are both turned off during an input mode (when an output is being disabled) to set an output in a high impedance state. In this case, a parasitic diode of the pn-junction is formed in a forward direction from a drain region of the p-channel MOS transistor, forming a pull-up driving side of the output stage, to which is applied 5 V, towards an n-well region (3 V power supply potential), such that reverse current flow occurs from an output terminal to the power supply potential within the semiconductor device. For inhibiting the reverse current flow by this parasitic diode, there is known a structure for isolating the well region of the p-channel MOS transistor, forming the pull-up driving side of the output stage, from the power supply potential. See for example the following reference (termed as a patent publication 1).

[Patent Document 1]
Japanese Patent Kokai Publication JP-A-9-238065 (see pages 3 and 4 and FIG. 1)

For understanding of a conventional tolerant buffer circuit, the circuit proposed in the above patent publication 1 is described as an example. FIG. 15 hereof shows the circuit structure described in this patent publication 1, in which the reference numerals are partially changed from those used in the patent publication 1. In FIG. 15, an output stage 1 is composed by a CMOS circuit made up by a p-channel MOS transistor P11 for pull-up driving (charging) connected across a power supply potential Vcc (+3 V) and an output terminal 11 and by an n-channel MOS transistor N11 for pull-down driving (discharging), connected across the output terminal 11 and the ground (GND). The p-channel MOS transistor P11 for pull-up driving has a well region n1 separated from the power supply Vcc (source side).

A pre-stage circuit 2 is made up by CMOS logic gates G1 and G2 and a CMOS inverter Iv2. When an enable signal E is at a high level, the pre-stage circuit is responsive to an input signal A to output a signal for complementary on/off control of the p-channel MOS transistor P11 and the n-channel MOS transistor N11 of the output stage 1. A tristate control circuit 3 is made up by CMOS inverters Iv31 and Iv32, p-channel MOS transistors P12 to P15, and n-channel MOS transistors N12 to N14. With the enable signal E at a low level, the tristate control circuit turns off both the p-channel MOS transistor P11 and the n-channel MOS transistor N1 of the output stage 1. The p-channel MOS transistors P11 to P15 are formed in the common well region n1. Of these, the p-channel MOS transistor P12 is interposed between the well region n1 of the p-channel MOS transistors P11 and the power supply Vcc and forms a well control circuit which, during enable time (signal E =high) or during disable time (signal E =low), connects the well region n1 to the power supply potential Vcc or disconnects the well region n1 from the power supply potential Vcc (source of the p-channel MOS transistor P11). The p-channel MOS transistor P13, having a gate connected to the power supply potential Vcc and having a drain and a source connected to a drain and a gate of the p-channel MOS transistor P11, respectively, forms a voltage by-pass circuit for forming a by-pass across the drain and gate of the p-channel MOS transistor P11 so that, when a high voltage of, for example, +5 V, is applied to the output terminal 11, the drain-to-gate voltage of the p-channel MOS transistor P11 does not exceed a thresholds value.

The p-channel MOS transistor P14 and the n-channel MOS transistor N12 form an input isolating circuit which, during the enable time, connects the gate of the p-channel MOS transistor P11 to the pre-stage circuit 2 (output of a CMOS logic gate GI) and, during the disable time, cuts off the gate of the p-channel MOS transistor P11 from the pre-stage circuit 2. During the disable time, the p-channel MOS transistor P15 and the n-channel MOS transistor N13 forms a MOS switching circuit for connecting the gates of the p-channel MOS transistors P12 and P14, forming the well controlling circuit and the input separation circuit, to the output terminal during the disable time.

If, in the circuit shown in FIG. 15, the enable signal E is set to a high level to set the enable state, the p-channel MOS transistor P11 of the output stage 1 is on/off controlled by the input signal A supplied via logic gate G1 and the MOS transistors N12, P14, while the n-channel MOS transistor N11 of the output stage 1 is on-off controlled complementarily with respect to the p-channel MOS transistor P11, by the input signal A supplied via the logic gate G2 and the inverter Iv2, in order to control the output terminal 11 to high or low responsive to the input signal (data signal) A. The p-channel MOS transistor P11 of the output stage 1 is turned on or off, at this time, as the well region n1 is connected via p-channel MOS transistor P12 to Vcc (+3 V). If the enable signal E is set to a low level (disabled state), the outputs of the logic gates G1 and G2 are set to a high level, without dependency on the state of the input signal A, and hence the p-channel MOS transistor P11 and the n-channel MOS transistor N11 are both set to the off-state, with the output being in a high-impedance state. If, in the disabled state, a voltage higher than the power supply potential Vcc is applied, the reverse current flow by the parasitic diode Ds of the p-channel MOS transistor P11 is inhibited, in such a manner as to inhibit the reverse current flow by the drain voltage of the p-channel MOS transistor P11 exceeding the reverse threshold value across the drain and the gate.

SUMMARY OF THE DISCLOSURE

However, in the conventional tolerant buffer circuit, to say nothing of the circuit described above with reference to FIG. 15, account is not taken of shortening the time from a state in which the enable signal E is set to a high level to set an enable state and the transistor of the output stage for pull-up driving is turned on until the enable signal E is set to a low level to turn off the pull-up driving transistor of the output stage.

For example, in the circuit shown in FIG. 15, the n-channel MOS transistor N13 and the p-channel MOS transistor P11 are turned on at a time point when the output mode (high output) is switched to the input mode, and the high voltage of the output terminal 11 is applied to the gate node of the p-channel MOS transistor P14 to turn off the p-channel MOS transistor P14. The result is that, of the n-channel MOS transistor N12 and the p-channel MOS transistor P14, forming a transmission gate, only the n-channel MOS transistor N12 is turned on, and hence the electric potential of the input side node n3 of the transmission gate is not transmitted sufficiently to the output side node n2 of the transmission gate, so that the p-channel MOS transistor P11 is not turned off completely, or certain time has to elapse until the p-channel MOS transistor P11 is turned off.

That is, when the output mode has been changed over to the input mode, the transistor for pull-up driving of the output stage is not turned off, or is turned off with a delay. In this case, the following problem arises.

For example, if a pull-down element is connected to an input/output terminal, the current flows from the power supply to the pull-down element through the pull-up transistor P11 which is not in the completely turned-off state.

Moreover, if, when the driving capability of a counterpart driver (for example, 20 of FIG. 15) connected to the input/output terminal (11 of FIG. 15) of the input/output buffer circuit is low, the input/output buffer circuit is changed over from the output mode to the input mode, and the counterpart driver, such as 20 of FIG. 15, outputs e.g. a low level, it may be an occurrence that the input/output terminal is pulled up by the pull-up transistor of the input/output buffer circuit, which is not in the completely turned-off state, such that the voltage thereof is not lowered to a low level. Thus, it is necessary to introduce a preset handshaking (bus protocol), such as permitting the counterpart side driver to start the driving after awaiting for a time sufficient that, when switching from the output mode to the input mode, the output of the tristate buffer circuit is in an high impedance state, thus interfering with speedup of the circuit operation.

Accordingly it is an object of the present invention to provide a semiconductor device having a tolerant buffer circuit, in which, when the output enable mode is switched to the disable mode, a transistor located on a pull-up side in the tolerant buffer circuit may speedily be turned off.

The above and other objects may be attained by a semiconductor device in accordance with an aspect of the present invention, which comprises a tristate buffer circuit including, on an output stage, at least a first transistor for pull-up driving and a second transistor for pull-down driving, in which, when a control signal is of a value indicating an enable state, an output is set to a high level or to a low level, depending on a data signal, and in which, when the control signal is of a value indicating a disable state, the first and second transistors are turned off to set a high impedance state of the output. The semiconductor device further includes a control means for performing control for speeding up the transition from the on-state to the off-state of the first transistor at the time of switching the control signal from the enable state to the disable state. According to the present invention, the control means includes a circuit which, when the control signal is of a value indicating the enable state, and a signal determining the on/off of the first transistor is of a level indicating the on-state of the first transistor, shortens the time until the signal determining the on/off of the first transistor is of a level of turning off the first transistor at the time of switching the control signal from the enable state to the disable state.

In a semiconductor device in accordance with another aspect of the present invention, the control means includes a timing adjustment circuit supplied with the control signal to output a second control signal delayed in transition timing from the enable state to the disable state of the control signal. The transmission gate, on/off controlled by the second control signal from the timing adjustment circuit at the time of switching from the enable state to the disable state of the control signal, quickens the transition from the on-state to the off-state of the first transistor by transmitting to the control terminal of the first transistor the level of the signal, which turns off the first transistor, and which is output from the logic circuit outputting a signal for turning the first transistor on or off, based on the data signal and the control signal, for a time of delay caused to the transition edge of the second control signal.

In a semiconductor device in accordance with another aspect of the present invention, the control means includes a circuit receiving the control signal to render the current path between the control terminal of the first transistor and the power supply at the time of switching from the enable state to the disable state of the control signal to set the control terminal of the first transistor to a voltage which changes the setting of the first transistor from the on-state to the off-state.

According to the present invention, described above, the time until complete turn-off of the transistor for pull-up driving during the mode switching from the output enable state to the disable state may be shortened to provide for a high-speed operation of the system having the mixed voltage circuit.

Still other objects and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

PREFERRED EMBODIMENTS OF THE INVENTION

Figure 1:
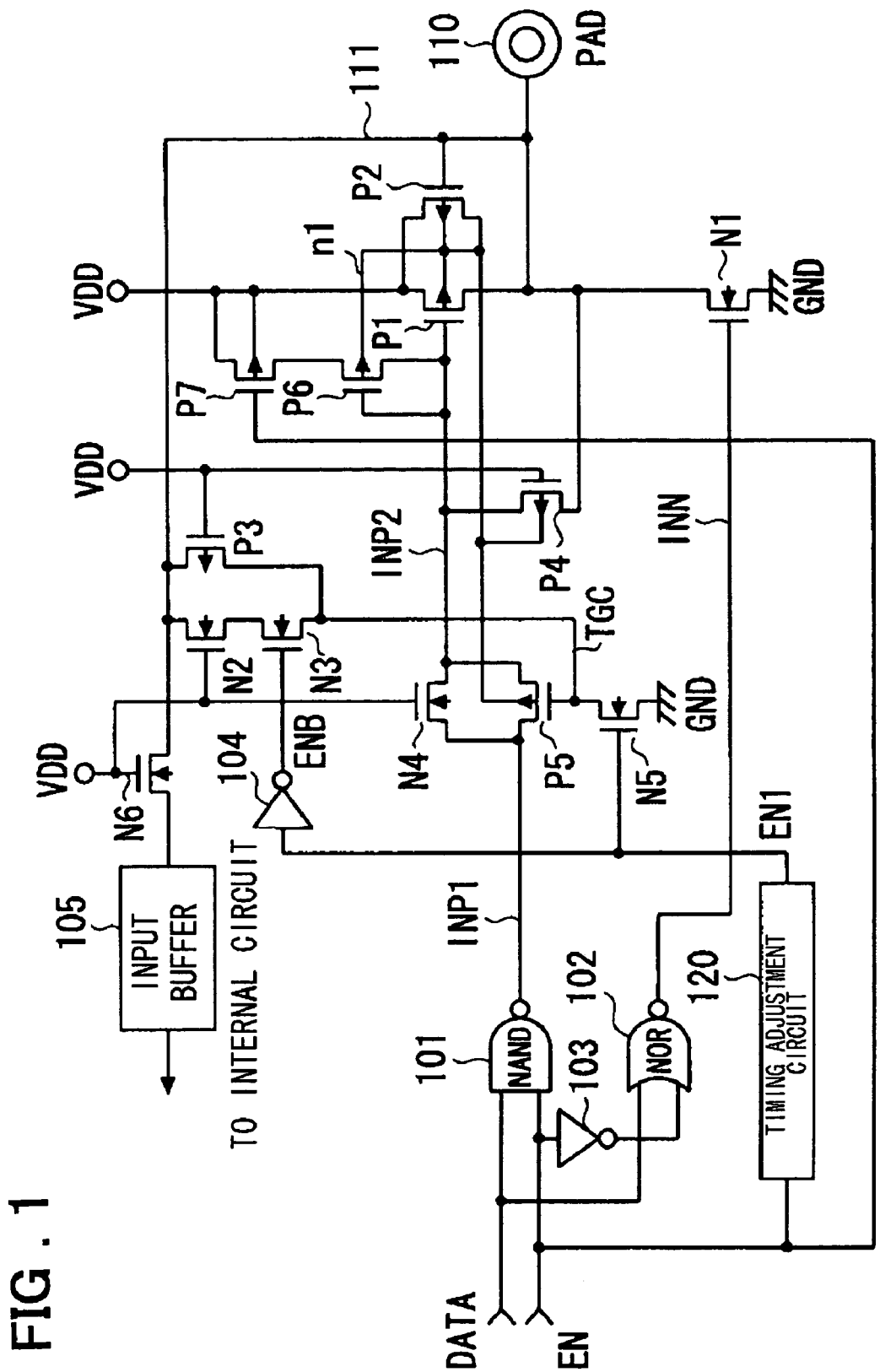
FIG. 1 shows the configuration of a first embodiment of the present invention.

Several embodiments of the present invention are described in the below. A semiconductor device in accordance with an embodiment of the present invention, includes a tristate buffer circuit which has an output stage, comprising at least a first transistor for pull-up driving (P1) and a second transistor for pull-down driving (N1), in which, when a control signal (EN) is of a value indicating an enable state, an output is set to a high level or to a low level, depending on a data signal (DATA), and in which, when the control signal is of a value indicating a disable state, the first and second transistors are turned off to set the output in a high impedance state. The semiconductor device further includes control means for performing control for speeding up the transition from the on-state to the off-state of the first transistor (P1) at the time of switching the control signal (EN) from the enable state to the disable state.

This control means includes a circuit which, when the control signal (EN) is of a value indicating the enable state, and a signal determining the on/off of the first transistor (P1) (for example, the signal voltage of the control terminal node INP2 of the first transistor (P1)) is of a level indicating the on-state of the first transistor (P1), shortens the time until the signal (the signal voltage of the node INP2) determining the on/off of the first transistor gets to a level of turning off the first transistor (P1) at the time of switching the control signal (EN) from the enable state to the disable state.

More specifically, a buffer circuit of the semiconductor device, according to an embodiment of the present invention, includes a first logic circuit (101) for receiving the data signal (DATA) to be output, and the control signal (EN), as an input, and for outputting a first signal (INP1) controlling the on/off of the first transistor (P1), and a transmission gate including a third transistor (P5) connected across the output of the first logic circuit (101) and the control terminal node of the first transistor (P1) and which is turned on when the control signal (EN) is of a value indicating the enable state to receive the first signal (INP1) output from the logic circuit to transmit the first signal to a control terminal of the first transistor (P1). The third transistor is turned off when the control signal (EN) is of the value indicating the disable state.

In an embodiment of the present invention, the control means for performing control to speed up the transition from the on-state to the off-state of the first transistor (P1) in switching from the enable state to the disable state of the control signal (EN) may include a timing adjustment circuit (120) which receives the control signal (EN) to output an control signal (EN1) for delaying the timing of changing over the state of the third transistor (P5) of the transmission gate from the on-state to the off-state at the time of switching the state of the control signal (EN) from the enable state to the disable state. When the control signal (EN) is switched from the enable state to the disable state, the control signal (EN1) is delayed in the transition timing from the enable state to the disable state. During this time, the third transistor (P5) of the transmission gate is in the on-state. During the time the third transistor (P5) is turned on, the transmission gate transfers the level of the first signal which is output from the logic circuit (101) to turn off the first transistor (P1) (signal output to the node INP1) to a control terminal node (node INP2) of the first transistor (P1) to speeds up the transition from the on-state to the off-state of the first transistor.

In an embodiment of the present invention, the first logic circuit (101), which receives the data signal (DATA) to be output and the control signal (EN), as inputs, and outputs the first signal (INP1), controlling the on/off of the first transistor (P1), outputs a second logic value (low), as the first signal (INP1), when the control signal (EN1) is in the enable state and when the data signal (DATA) is of the first logic value (high). The first logic circuit outputs the first logic value (high) as the first signal (INP1), without dependency on the data signal (DATA), when the control signal (EN1) is in the disable state. The first transistor (P1) for pull-up driving, on the output stage, is turned on and off when the control terminal of the first transistor (P1) is of the second logic value (low) and of the first logic value (high), respectively.

In an embodiment of the present invention, the timing adjustment circuit 120 receives the control signal (EN) to output the second control signal (EN1) which is obtained by delaying the transition from the enable state to the disable state of the control signal (EN). The third transistor (P5) of the transmission gate is changed over from the on-state to the off-state based on the transition from the enable state to the disable state of the second control signal (EN1) output from the timing adjustment circuit (120). The timing adjustment circuit (120) may include a delay circuit for delaying the control signal (EN) a preset time and for outputting the delayed signal. Alternatively, the timing adjustment circuit may include a delay circuit for receiving and delaying the control signal (EN) a preset time and for outputting the so delayed signal, and a logic circuit for receiving the control signal (EN) and an output signal of the delay circuit and for delaying the transition from the enable state to the disable state of the control signal a preset time to output the so delayed signal as the second control signal (EN1).

In an embodiment of the present invention, there is provided, as control means for performing control for speeding up the transition from the on-state to the off-state of the first transistor (P1) at the time of switching from the enable state to the disable state of the control signal (EN), a cascaded transistor circuit (serially connected transistors) connected across the control terminal node (INP2) of the first transistor and the power supply (VDD). When the control signal is of a value indicating the enable state, the control circuit sets an electrically non-conductive state of a path between the power supply (VDD) and the control terminal node (INP2) of the first transistor (P1) and, when the control signal is of a value indicating the disable state, the control circuit sets an electrically conductive state of the path between the power supply (VDD) and the control terminal node (INP2) of the first transistor (P1) to set the voltage of the control terminal node (INP2) of the first transistor (P1) to a level of turning off the first transistor (P1). More specifically, the cascaded transistor circuit includes a switching transistor (P7) which is on/off controlled by the control signal (EN), and a transistor (P6) connected in a diode configuration, in which the transistor (P7) and (P6) are serially connected across the power supply (VDD) and the control terminal node (INP2) of the first transistor (P1).

In an embodiment of the present invention, there is provided a second logic circuit (102) for receiving a data signal (DATA) to be output and a control signal (EN) and for outputting a second signal (INN) for on/off controlling the second transistor (N1). An output terminal of the second logic circuit (102) is connected to the control terminal of the second transistor (N1). When the control signal (EN) indicates the enable state and the data signal (DATA) is of the second logic value (low), the second logic circuit (102) outputs a first logic value (high) as the second signal (INN) and, when the control signal (EN) indicates the enable state, the second logic circuit outputs a second logic value (low) without dependency upon the data signal (DATA). The second transistor (n1) is turned on and off when the control terminal thereof is of the first and second logic values, respectively.

In an embodiment of the present invention, there is provided a bypass circuit (P4) connected across the control terminal (gate) of the first transistor (P1) and an output node (drain) thereof for forming a bypass across an output node of the first transistor (P1) and a control terminal of the first transistor (P1) when the voltage applied to a pad (110) connected to the output node of the first transistor (P1) is higher than the power supply voltage (VDD).

In an embodiment of the present invention, the transmission gate includes a third transistor (P5) of the first conductivity type, which is turned on when the second control signal (EN1) from the timing adjustment circuit (120) is of a value indicating the enable state, and a fourth transistor (N4) of the second conductivity type, to the control terminal of which is applied the power supply potential. There is provided, across the control terminal of the third transistor (P5) and the pad (110) connected to the output of the tristate buffer circuit, a series circuit of a fifth transistor (N2) of the second conductivity type, to the control terminal of which is applied the power supply voltage VDD, and a sixth transistor (N3) of the second conductivity type, which is turned off and on when the second control signal (EN1) from the timing adjustment circuit (120) is of a value indicating the enable state and a value indicating the disable state, respectively. In addition, a seventh transistor (P3) of the first conductivity type, to the control terminal of which is applied the power supply voltage VDD, is connected in parallel with the series circuit, across the control terminal of the third transistor (P5) and the pad. In an another embodiment of the present invention, the fifth transistor (N2) of the second conductivity type, to the control terminal of which is applied the power supply voltage VDD, may be omitted, in which case a seventh transistor (P3) of the first conductivity type is connected in parallel with a sixth transistor (N3) of the second conductivity type, which is connected across the control terminal of the third transistor (P5) and the pad (110) and which is turned off and on when the second control signal (EN1) from the timing adjustment circuit 120 is of a value indicating the enable and the disable state, respectively.

In an another embodiment of the present invention, in which no timing adjustment circuit is provided, and the control means for performing control to speed up the transition from the on-state to the off-state of the first transistor (P1) is formed by a cascaded transistor circuit (P6, P7), the transmission gate is provided with a third transistor (P5) of the first conductivity type, which is turned on when the control signal (EN) is of a value indicating the enable state, and a fourth transistor (N4) of the second conductivity type, to the control terminal of which is supplied the power supply voltage. There is further provided a series circuit made up of a fifth transistor (N2) of the second conductivity type, connected across the control terminal of the third transistor (P5) and the pad (110) connected to the output of the tristate buffer circuit and to the control terminal of which is applied the power supply voltage (VDD) and a sixth transistor (N3) of the second conductivity type turned off and on when the control signal (EN) is of a value indicating the enable state and in the disable state, respectively. A seventh transistor (P3) of the first conductivity type, to the control terminal of which is applied the power supply voltage (VDD), is connected across the control terminal of the third transistor (P5) and the pad in parallel with the series circuit. In a further embodiment of the present invention, the fifth transistor (N2) of the second conductivity type, to the control terminal of which is applied the power supply voltage (VDD), may be omitted, and a sixth transistor (N3) of the second conductivity type, turned off and on when the control signal (EN) is of a value indicating the enable state and in the disable state, respectively, is provided across the control terminal of the third transistor (P5) and the pad (110), while a seventh transistor (P3) of the first conductivity type, to the control terminal of which is applied the power supply voltage (VDD), is connected across the control terminal of the third transistor (P5) and the pad in parallel with the sixth transistor (N3).

In an embodiment of the present invention, an eighth transistor (P2) having a control terminal connected to a pad (110) forming an output of the tristate buffer circuit is provided in a well region common to the well region (n1) of the first transistor (P1). The eighth transistor (P2) is of the same conductivity type as the first transistor (P1). The common well region (n1) and the power supply is controlled to be in a cut off-state through the eighth transistor (P2) when the voltage applied to the pad is equal to or higher than the power supply voltage of the tristate buffer circuit.

In an another embodiment, the eighth transistor (P2) may be provided in a well region distinct from the well region of the first transistor (P1), and the distinct well region may be connected for example through an interconnection and a contact to the well region of the first transistor (P1), thereby making the potentials of both wells equal. The third transistor (P5) composing the transmission gate, the transistor (P6) of a diode connection composing the cascaded circuit, and the transistor (P4) composing the bypass circuit, are formed in the well region (n1) (floating well) common to the well region of the first transistor (P1). Alternatively, the well region, in which are formed the third transistor (P5), the transistor (P6) of a diode connection composing the cascaded circuit, and the transistor (P4) of the bypass circuit, may be connected by e.g. interconnections to the well region of the first transistor (P1) and the eighth transistor (P2) to provide for potential equalization.

In an another embodiment of the present invention, the control means for performing control for speedup of the transition from the on-state to the off-state of the first transistor (P1) may be provided with means (120A) for receiving a signal reflecting the voltage of the pad (110) connected to the output of the tristate buffer circuit (input signal from the pad) and the control signal (EN), and for performing control so that, when the voltage of the pad (110) indicates a high level voltage (for example, the voltage not lower than the power supply voltage VDD), the signal reflecting the voltage of the pad (110) (input signal from the pad) causes the third transistor (P5), comprising the transmission gate, to be turned on transiently during transition from the enable state to the disable state of the control signal (EN).

In a further embodiment of the present invention, a one-shot pulse generating circuit (130) may be provided which is responsive to the control signal (EN) to detect the changeover from the enable state to the disable state of the control signal (EN) for generating a one-shot pulse signal of a preset pulse width, while a discharge transistor (N7) may also be provided which is connected across the output of the tristate buffer circuit and the ground (GND) and which is turned on during the time period prescribed by the pulse width of the one-shot pulse signal from the one-shot pulse generating circuit.

In a further embodiment of the present invention, a one-shot pulse generating circuit (130) may be provided which is responsive to the control signal (EN) to detect the changeover from the enable state to the disable state of the control signal (EN) for generating a one-shot pulse signal of a preset pulse width. There may be provided a logic circuit (107) for receiving the data signal and an output signal of the one-shot pulse generating circuit to generate a signal which turns on the second transistor (N1) when the data signal is of the second logic value (low) or when the one-shot pulse signal is active.

In a further embodiment of the present invention, there may be provided a tenth transistor (N5) and an eleventh transistor (N5') (see for example N5' of FIG. 14) connected in series between the control terminal of the third transistor (P5) of the transmission gate and a second power supply providing the ground potential, in order to improve voltage withstand characteristics. The tenth transistor (N5) has a control terminal for receiving the second control signal (EN1) output from the timing adjustment circuit (120) and is turned on and off when the second control signal is of a value indicating the enable state and the disable state, respectively. The eleventh transistor (N5'), which is connected across the output of the tenth transistor (N5) and the control terminal of the third transistor (P5), has a control terminal supplied with the power supply voltage. A twelfth transistor, the control terminal of which is supplied with the power supply voltage, may be connected across the pad (110) and the output of the second transistor (n1) for pull-down (see for example N1' of FIG. 14).

In an embodiment of the present invention, there may be provided an I/O buffer circuit including a pad (110) connected to an output of the tristate buffer circuit and an input buffer connected to the pad (110). The I/O buffer circuit is set to an output mode of outputting a level corresponding to the data signal from the tristate buffer circuit to the pad (110) when the control signal (EN) is of a value indicating the enable state. The I/O buffer circuit is set to an input mode of receiving a signal applied to the pad (110) by the input buffer when the control signal (EN) is of a value indicating the disable state.

[Embodiments]

For further explanation of the above-described embodiments of the present invention, embodiments of the present invention will now be explained with reference to the drawings. FIG. 1 shows the configuration of a first embodiment of the present invention. The present invention includes a control means in a tolerant buffer circuit which controls a signal determining the on/off of the pull-up driving transistor of the output stage so that the pull-up driving transistor will be turned off more quickly, when an enable signal switches from an output enable to an output disable. This controlling means in the present embodiment comprises a timing adjustment circuit 120 and cascaded transistor circuit (P6 and P7).

More specifically, referring to FIG. 1, the buffer circuit of the present embodiment includes a NAND circuit 101 for receiving a data signal DATA and an enable signal EN, as first and second inputs, respectively, an inverter 103 for receiving the enable signal E, and a NOR circuit 102 for receiving an output signal of the inverter 103 and the data signal DATA as first and second inputs, respectively.

As an output stage, there are provided a p-channel MOS transistor P1 for pull-up driving, which has a source connected to a power supply VDD, a gate connected to a node INP2 and a drain connected to a pad 110, and an n-channel MOS transistor n1 for pull-down, which has a source connected to a ground and a gate connected to an output node INN of the NOR circuit 102. The n-channel MOS transistor n1 is constituted as a high voltage withstand transistor.

A P-channel MOS transistor P2, which has a source connected to the source of the p-channel MOS transistor P1 and having a drain and a back gate connected in common, is interposed between a well region n1 of the p-channel MOS transistor P1 and a power supply VDD, and connects, with the enable signal EN in an active state, the well region n1 of the p-channel MOS transistor P1 to the power supply VDD, while disconnecting, in the disabled state (when the pad 110 is in the high voltage state), the well region n1 of the p-channel MOS transistor P1 from the power supply (the source of the p-channel MOS transistor P1). This well region n1 is also termed the 'floating well region'.

A p-channel MOS transistor P4 is inserted across the gate and the drain of the p-channel MOS transistor P1. The gate of the p-channel MOS transistor P4 is connected to the power supply VDD. The p-channel MOS transistor P4 is also provided in the n-well 1 in common with the p-channel MOS transistor P1 for pull-up driving. Alternatively, the respective well regions of the p-channel MOS transistors P4 and P2 may be connected to the well region of the p-channel MOS transistor P1 by interconnections and contacts to make the electric potentials of respective well regions equal.

The buffer circuit according to the present embodiment includes a timing adjustment circuit 120 which receives the enable signal EN, an n-channel MOS transistor N5, which has a gate supplied with an output signal EN1 from the timing adjustment circuit 120 and a source set to the ground potential, and a transmission gate inserted across an output node INP1 of a NAND circuit 101 and a gate node INP2 of the p-channel MOS transistor P1 for pull-up driving. The transmission gate, also termed a transfer gate, is composed by complementary transistors P5 and N4. The gates of the p-channel MOS transistor P5 and the n-channel MOS transistor N4 of the transmission gate are connected to the drain of the n-channel MOS transistor N5 and to the power supply VDD, respectively. The transmission gate (P5, N4) receives the signal level of the node INP1 to control the conduction/cut-off of the signal level of the node INP1 to the node INP2. The p-channel MOS transistor P5 is provided in the n-well n1 common to the well n1 in which is provided the p-channel MOS transistor P1 for pull-up driving. Alternatively, the well region of the p-channel MOS transistor P5 may be connected to the well region of the p-channel MOS transistors P5 and P2 by interconnections and contacts to make the potentials of respective well regions equal.

In the present embodiment, there are further provided an n-channel MOS transistor N2 and a p-channel MOS transistor P3. The n-channel MOS transistor N2 has a drain connected over a signal line 111 to the pad 110 and a gate connected to the power supply VDD, respectively, an n-channel MOS transistor N3, which has a drain connected to the source of the n-channel MOS transistor N2, a gate connected to an output ENB of an inverter 104 for inverting the output of the timing adjustment circuit 120 and a source connected to the gate of the p-channel MOS transistor P5. The p-channel MOS transistor P3, has a source connected to the pad 110, a gate connected to the power supply VDD and a drain connected to the gate of the p-channel MOS transistor P5. There is further provided a depletion type n-channel MOS transistor N6, which has a drain and a gate connected to the pad 110 and to the power supply VDD. The source of the n-channel MOS transistor N6 is connected to the input end of an input buffer 105. The signal entered to the pad 110 is supplied from the input buffer 105 to an internal circuit (a circuit arranged on the inside of an I/O area of the semiconductor device), not shown.

The operation of the circuit shown in FIG. 1 is now schematically explained. In case the tristate buffer circuit is outputting a high level to the pad 110 in the output mode (enable state), the enable signal is at a high level, while the data signal DATA is at a high level. At this time, the signal EN1 is at a high level, so that the n-channel MOS transistor N5, a gate of which is supplied with the signal EN1, is turned on, with the gate potential of the p-channel MOS transistor P5 being at a low level. Thus, the p-channel MOS transistor P5 is turned on and the output voltage (low level) of the NAND circuit 101 is propagated through the transmission gate (N4, P5) to the node INP2 to turn on the p-channel MOS transistor P1 to charge the pad 110 from the power supply VDD. This sets the pad 110 to a high level (power supply voltage VDD). On the other hand, the output (INN) of the NOR circuit 102 is at a low level to turn off the n-channel MOS transistor N1.

When the output enable state is changed over to the disable state, the enable signal EN is changed from a high level to a low level. The NAND circuit 101 outputs a high level, and the timing adjustment circuit 120 outputs the signal EN1, which is a signal corresponding to the enable signal EN the fall transition timing (falling edge) of which is delayed by a preset delay time td, to turn off the n-channel MOS transistor N5 with a time delay of td. The n-channel MOS transistor N3, a gate of which is supplied with an inverted version of the signal EN1, is also turned on with the time delay of td.

If, with the output disable, the enable signal EN goes low, the node INP1 (INP2) goes high, while the output node INN of the NOR circuit 102 goes low to turn off both the p-channel MOS transistor P1 and the n-channel MOS transistor n1.

The n-channel MOS transistor N5 is turned off with a time delay of td, as set by the timing adjustment circuit 120, as from a time point when the enable signal EN has been changed from a high level to a low level, so that the p-channel MOS transistor P5 continues to be turned on for a time longer by the time delay of td. During this prolonged time, the potential of the node INP1 is propagated to the node NP2 through the transmission gate, formed by the complementary transistor pair P5 and N4, to turn off the p-channel MOS transistor P1 completely. That is, at the fall time of the enable signal EN, the timing adjustment circuit 120 generates the signal EN1 (the delay time of td) for securing the time td until a high level of the node INP1 is propagated through the transmission gate to the node INP2 to raise the potential of the node INP2 to turn off the p-channel MOS transistor P1 completely.

In the disable state, the enable signal EN goes low, so that the p-channel MOS transistor P7, the gate of which is supplied with the enable signal EN, is turned on. The potential of the gate of the p-channel MOS transistor P6 (node INP2) is initially at a low level, that is, the p-channel MOS transistor P1 is in the on-state until directly before the enable signal EN falls to a low level, and outputs a high level to the pad 110. Thus, the potential of the node INP2 is raised to the power supply voltage VDD through the p-channel MOS transistor P7 and the p-channel MOS transistor P6, which has a gate and a drain connected to the node INP2 (diode connection), to turn off the p-channel MOS transistor P1. The p-channel MOS transistor P6 is formed in the floating well n1. Meanwhile, the well region of the p-channel MOS transistor P6 may be connected to the well region of the p-channel MOS transistors P1 and P2 by interconnections and contacts to make the respective well regions equal.

Even when a voltage higher than the power supply voltage VDD of the tristate buffer circuit is supplied to the pad 110, the voltage supplied to the internal circuit (input buffer 105) is at its maximum the power supply voltage VDD by the depletion type n-channel MOS transistor N6 connected to the signal line 111.

Thus, with the present embodiment, the pull-up driving transistor may be completely turned off at an earlier time, during switching from a high level outputting state of the output mode to a high impedance state, thus shortening the time needed in mode switching to achieve a high-speed operation.

The operation of the p-channel MOS transistor P3 is now explained. In case a voltage, such as 5.5 V, higher than the power supply voltage VDD, such as 3 V, is supplied to the pad 110 from a counterpart driver, not shown, the gate voltage of the p-channel MOS transistor P5 is not raised to the high voltage (5.5 V), if the gate voltage of the p-channel MOS transistor P5 is connected the only by the n-channel MOS transistors N2 and N3, both being in the on state to the pad 110. The high voltage (5.5 V) is applied from the pad 110 to the node INP2 through the p-channel MOS transistor P4. By the p-channel MOS transistor P3, the gate, the drain and the well n1 of the p-channel MOS transistor P5 are at the equal potential, such that, in the output disable state, the p-channel MOS transistor P5 of the transmission gate may be completely turned off.

Figure 2A:
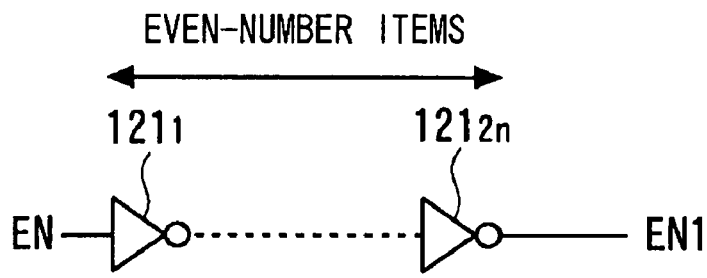
FIGS. 2A and 2B show the configuration of a timing adjustment circuit shown in FIG. 1.
Figure 2B:
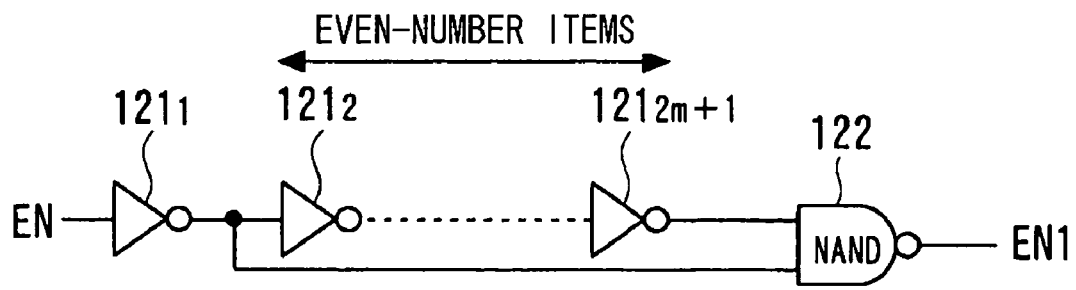

FIGS. 2A and 2B show an illustrative configurations of the timing adjustment circuit 120. Referring to FIG. 2A, the timing adjustment circuit 120 may be composed by a delay circuit made up by an even number of inverter stages. In this case, the output control signal EN1 has a rising edge and a falling edge delayed equally. Thus, when the control signal EN undergoes the transition from a low level to a high level, the switching to the output mode is delayed.

As a modification of the present embodiment, the timing adjustment circuit 120 may be so constructed that the gate length L of the MOS transistor composing an output stage of the non-inverting buffer circuit is set to be longer, that is, the ratio W/L, where W is a constant gate width, is set to be smaller, to lower the current driving ability to provide a delay time. Alternatively, the ratio W/L of the n-channel MOS transistor of an output stage inverter of two-stage inverters composing the non-inverting buffer circuit may be reduced to lower the discharging capability so that only the falling edge of the signal is delayed, while the rising edge of the signal is not delayed.

A further configuration of the timing adjustment circuit 120, as shown in FIG. 2B, includes a NAND circuit 122 which receives a signal output from an inverter 121, and a signal output from a delay circuit which delays the signal obtained by inverting the control signal EN by the inverter $121_1$, and which is made up by an even-number stages of inverters $121_2$ to $121_{2m+1}$, where m is a preset positive integer. As for an output of the NAND circuit 122, the rising edge of the control signal EN is directly output, while its falling edge is output with a delay of propagation delay time td of the even-numbered stage of inverters 1212 to $121_{2m+1}$. That is, the waveform of the output signal of the NAND circuit 122 is a waveform of a pulse width in which the leading edge of the pulse of the signal EN is left intact and the trailing edge thereof is elongated by the delay time td.

The present invention is not limited to the structure of the above-described embodiments. That is, the combination of the timing adjustment circuit and/or the cascaded transistor circuit may be changed depending on e.g., design parameters.

Figure 3:
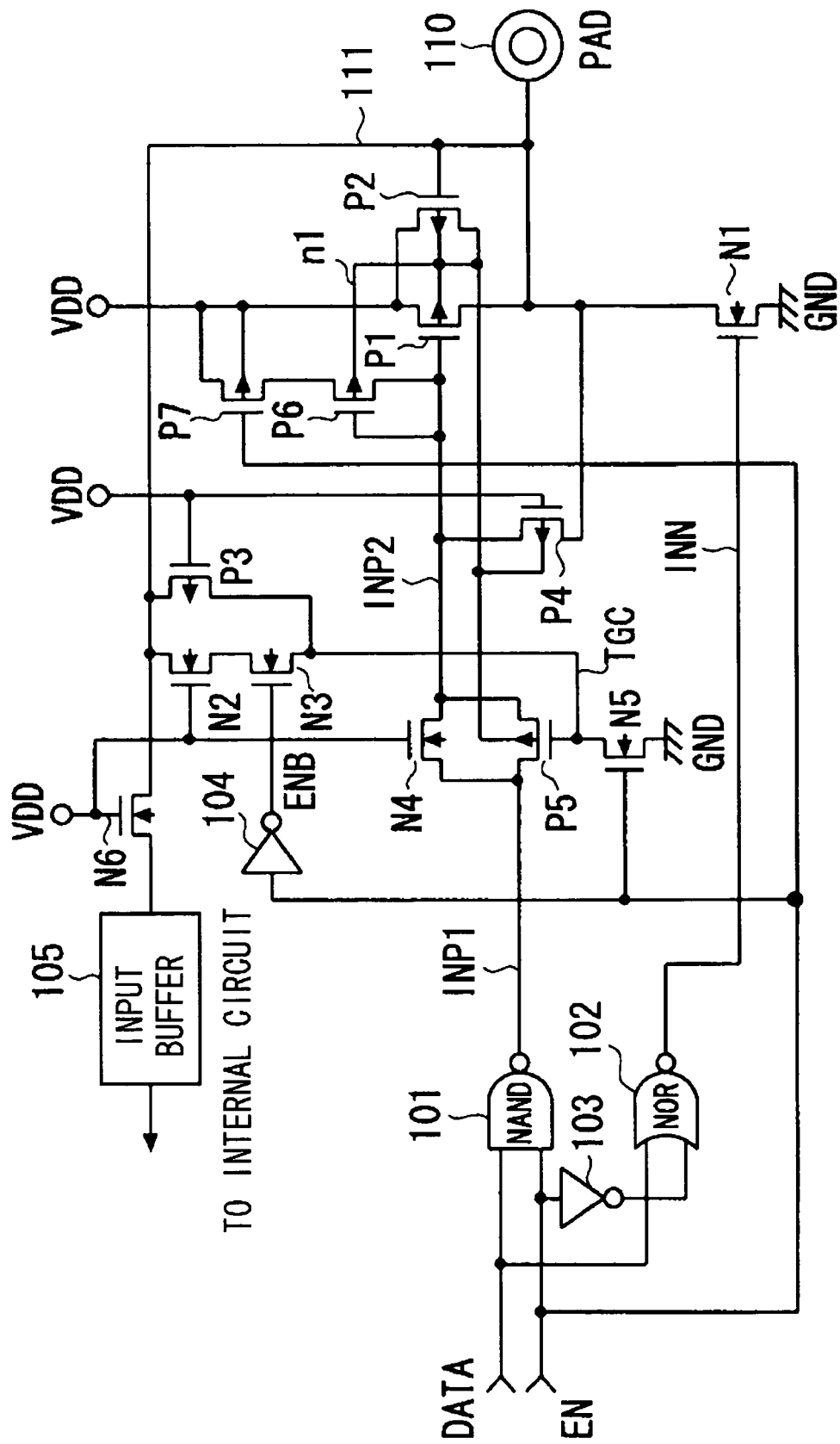
FIG. 3 shows the configuration of a second embodiment of the present invention.

FIG. 3 shows the configuration of a second embodiment of the present invention. In FIG. 3, parts or components which are similar to those shown in FIG. 1 are indicated by the same reference numerals. The buffer circuit according to the second embodiment of the present invention corresponds to the buffer circuit of the first embodiment, shown in FIG. 1, with the timing adjustment circuit 120 being omitted. As a pull-up circuit to a high level of the gate node IP2 of the p-channel MOS transistor P1 for pull-up driving of the output stage, during the transition from a high level to a low level of the enable signal EN, there is provided a serial circuit (cascaded circuit) of a switching p-channel MOS transistor P7 and a p-channel MOS transistor P6, connected in a diode configuration across the power supply VDD and the node INP2.

In the present embodiment, the timing adjustment circuit 120 used in the first embodiment is not provided, so that, when the enable signal EN is changed from a high level to a low level, the p-channel MOS transistor P5 composing the transmission gate is turned off immediately and a high level voltage of the node INP1 is propagated through the n-channel MOS transistor N4 to the node INP2. However, the gate node INP2 of the p-channel MOS transistor is pulled up towards the power supply voltage VDD through the p-channel MOS transistors P6 and P7 to shorten the time until complete turnoff of the p-channel MOS transistor P7 for pull-up driving.

As a third embodiment of the present invention, the timing adjustment circuit 120 of FIG. 1 may be retained, while the cascaded circuit (P6, P7), connected across the power supply voltage VDD and the node INP2, may be omitted.

Figure 4:
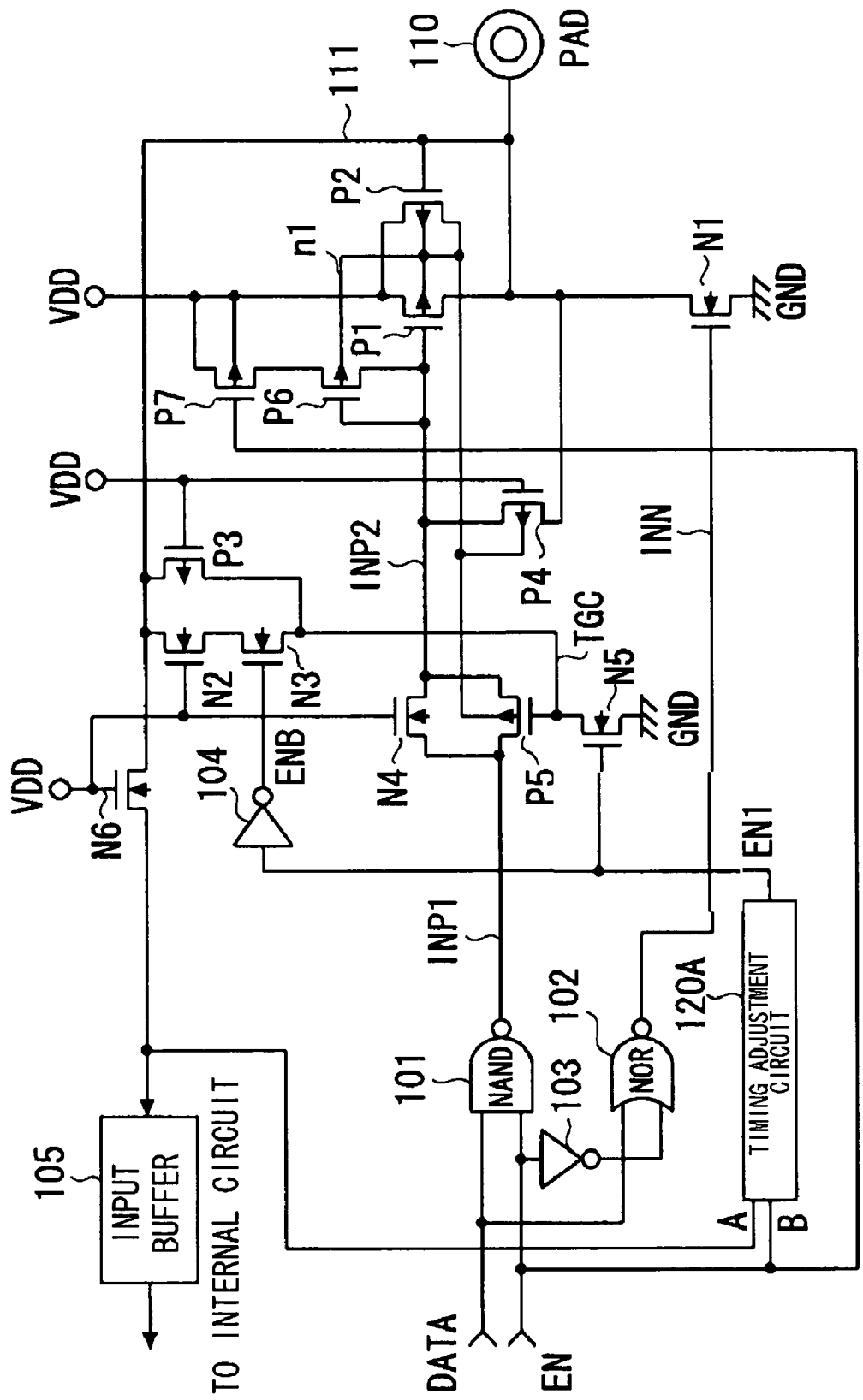
FIG. 4 shows the configuration of a fourth embodiment of the present invention.

A fourth embodiment of the present invention is now explained. FIG. 4 shows the configuration of the fourth embodiment of the present invention. In FIG. 4, parts or components which are similar to those shown in FIG. 1 are indicated by the same reference numerals. Referring to FIG. 4, showing the fourth embodiment of the present invention, the configuration of a timing adjustment circuit 120A differs from the structure of the embodiment shown in FIG. 1. In other respects, the present fourth embodiment is the same as the embodiment shown in FIG. 1.

The timing adjustment circuit 120 of the first embodiment, shown in FIG. 1, receives the enable signal EN and delays the falling edge thereof to output the resulting signal as signal EN1.

In contrast, a timing adjustment circuit 120A of the present embodiment, shown in FIG. 4, receives an output signal of the depletion type n-channel MOS transistor N6, connected across a signal line 111 connected to the pad 110 and the input buffer 105 (an input signal supplied to the pad 110) and the enable signal EN, via input terminals A and B, to generate and output a one-shot pulse signal EN1, during transition of the enable signal EN1 from a high level (enable state) to a low level (disable state) of the enable signal, in case the output signal of the n-channel MOS transistor N6 is at a high level (that is, in case the voltage applied to the pad 110 is not less than the power supply voltage VDD). If the output signal of the n-channel MOS transistor N6, supplied to the input terminal A, is at a low level, the timing adjustment circuit 120A does not produce one-shot pulse at the time of transition from a high level to a low level of the enable signal EN.

Figure 5A:
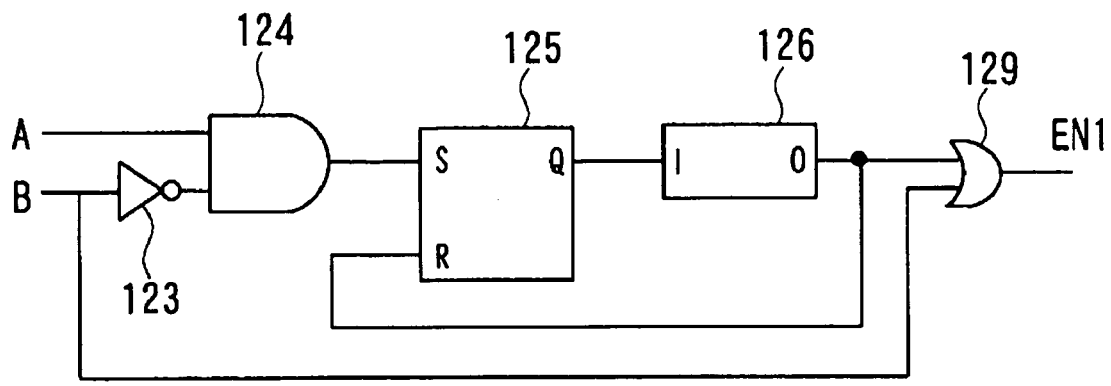
FIG. 5A shows the configuration of a timing adjustment circuit shown in FIG. 4.

FIG. 5A shows an illustrative configuration of the timing adjustment circuit 120A. The timing adjustment circuit includes an AND circuit 124, an SR flip-flop circuit 125, and a one-shot pulse generating circuit 126. The AND circuit 124 receives an output of an n-channel MOS transistor N6, connected to the pad, and an enable signal EN from terminals A and B respectively, and takes a logical product of the signal obtained by inverting the signal from the terminal B by an inverter 123 and the signal from the terminal A. The SR flip-flop circuit 125 receives an output signal of the AND circuit 124 at its set terminal S and sets (outputs a high level at an output Q) when the output signal of the AND circuit 124 is high. The one-shot pulse generating circuit 126 generates a one-shot pulse from the rising edge of the SR flip-flop circuit 125. An output of the one-shot pulse generating circuit 126 is fed back to a reset terminal R of the SR flip-flop circuit 125.

Referring to FIGS. 4 and 5A, the operation of the timing adjustment circuit 120A of the present embodiment is explained. When the enable signal EN is at a low level (output disable state) and an output signal of the n-channel MOS transistor N6 is at a high level, the AND circuit 124 of the timing adjustment circuit 120A outputs a high level. The AND circuit 124 of the timing adjustment circuit 120A is responsive thereto to be set asynchronously so that its output Q is set to a high level. The one-shot pulse generating circuit 126 is responsive to transition of the output Q of the SR flip-flop circuit 125 from a low level to a high level to output a one-shot pulse of a preset pulse width. The SR flip-flop circuit 125 is reset, on receipt at a reset terminal R of the one-shot pulse output from the one-shot pulse generating circuit 126, so that the output Q is reset to a low level.

When the output signal of the n-channel MOS transistor N6 (signal entered to the terminal A) is low, the output signal of the AND circuit 124 is at a low level and the SR flip-flop circuit 125 is kept in the reset state (with the output Q in a low level). The SR flip-flop circuit 125 is composed by a NOR type circuit of a small circuit size. Specifically, the SR flip-flop circuit 125 may be made up by first and second NOR circuits, the first input terminals of which are supplied with a set (S) signal and with a reset signal R, with the output of the first NOR circuit being connected to the second input terminal of the second NOR circuit and with the output of the second NOR circuit being connected to the second input terminal of the first NOR circuit. The timing adjustment circuit 120A may also be provided with an OR circuit 129 for taking the logical sum of an output signal O of the one-shot pulse generating circuit 126 and the enable signal EN supplied to the terminal B, in order that the signal EN1 shall be output at a high level when the input enable signal EN has been changed from a low level to a high level (enable state).

In the present embodiment, the enable signal EN and a signal supplied to the pad 110 during the input mode are sensed to control the speedup of the transition to the off state of the p-channel MOS transistor P1 for pull-up driving during transition from the enable state to the disable state. That is, when the enable signal EN is changed from a high level to a low level, and the input signal (output signal of the n-channel MOS transistor N6) is at a high level, the signal EN1 of the one-shot pulse waveform is generated. By the one-shot pulse signal EN1, the n-channel MOS transistor N5 is turned on during the period corresponding to the pulse width. On the other hand, the n-channel MOS transistor N3 is turned off, so that the gate voltage of the p-channel MOS transistor P5 is at the ground voltage to turn on p-channel MOS transistor P5 to transfer the high voltage of the output node INP1 of the NAND circuit 101 to the node INP2. On the other hand, if the input signal (output signal of the n-channel MOS transistor N6) is at a low level, the SR flip-flop circuit 125 keeps on to be reset, without being set, when the enable signal EN has been changed from a high level to a low level.

Figure 5B:
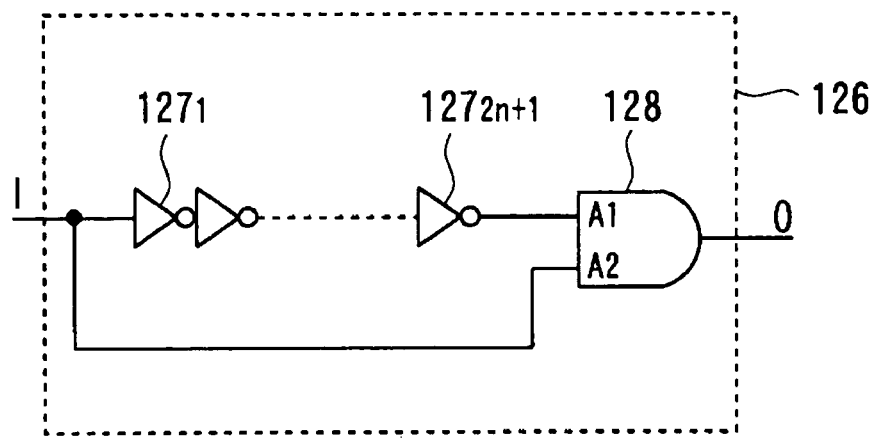
FIG. 5B shows the configuration of a one-shot circuit shown in FIG. 5A
Figure 5C:
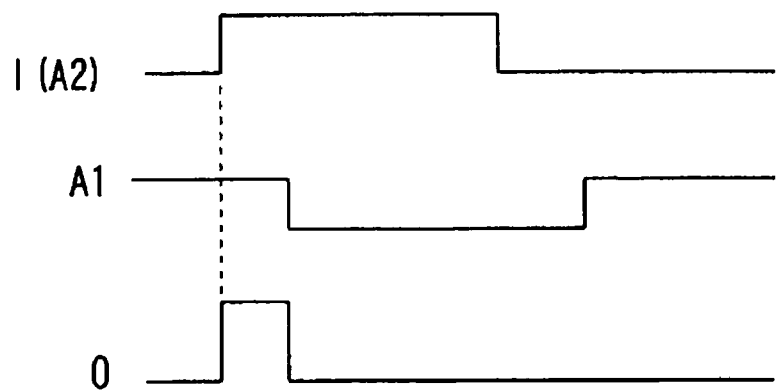
FIG. 5C illustrates the timing operation of the one-shot circuit.

FIG. 5B shows a configuration of the one-shot pulse generating circuit 126. FIG. 5C illustrates the timing operation of the one-shot pulse generating circuit 126. This one-shot pulse generating circuit 126 includes an AND circuit 128 which receives an input signal I and a signal corresponding to the input signal I delayed by a delay circuit made up by an odd-number stage of inverters $127_1$ to $127_{2n+1}$, where n is a positive integer, and outputs a one-shot pulse having a pulse width equal to the delay time of the delay circuit and having the rising edge synchronized with the rising edge of the input signal I.

Figure 6:
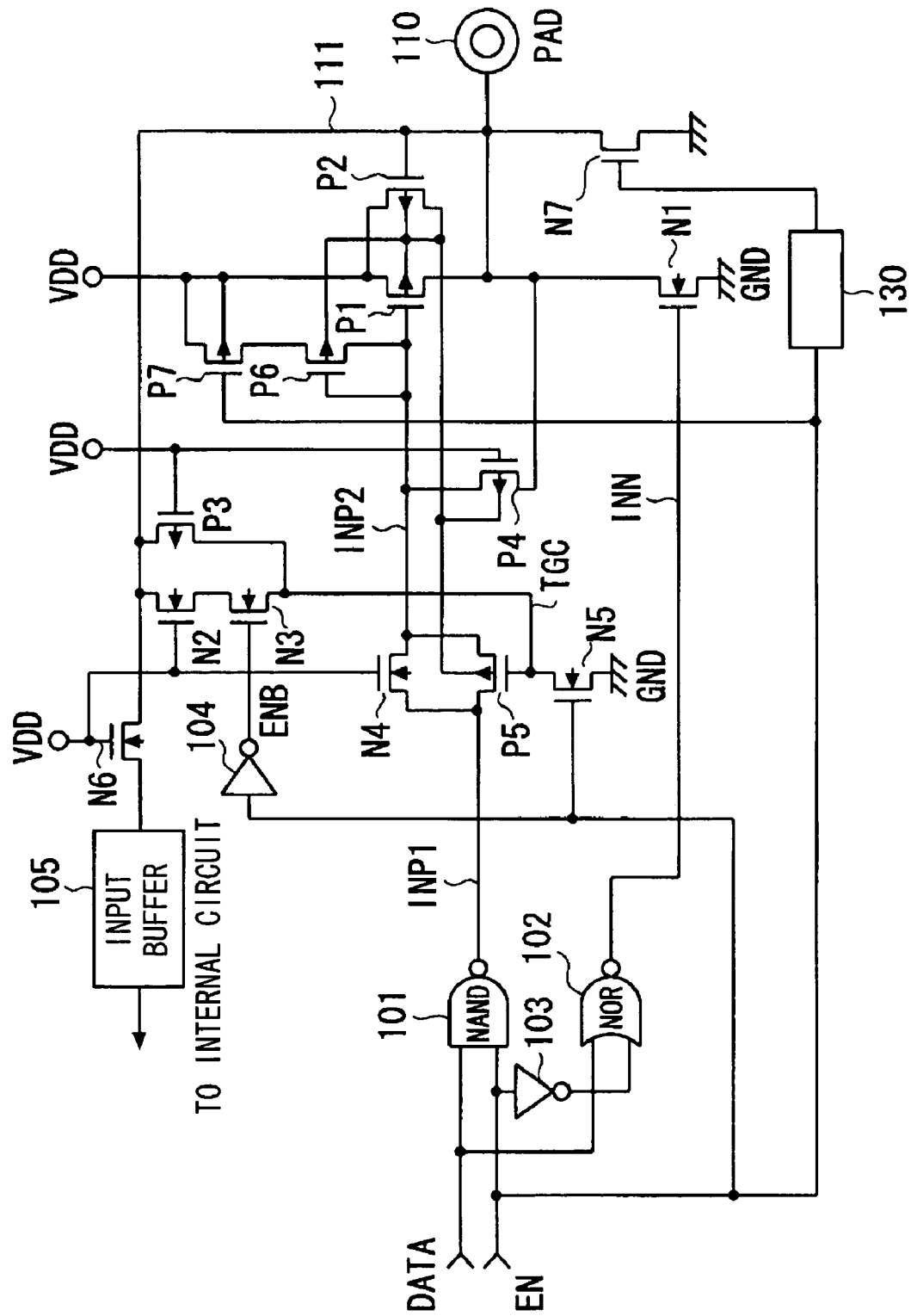
FIG. 6 shows the configuration of a fifth embodiment of the present invention.

A fifth embodiment of the present invention is described in the below. FIG. 6 shows a configuration of the fifth embodiment of the present invention. In FIG. 6, parts or components which are similar to those shown in FIG. 1 are indicated by the same reference numerals. Referring to FIG. 6, the present fifth embodiment is devoid of the timing adjustment circuit 120 of FIG. 1, and is provided with an n-channel MOS transistor N7, connected across the pad 110 and the ground in parallel with the pull-down transistor N1 and a one-shot pulse generating circuit 130 which receives the enable signal EN, and has an output connected to the gate of the n-channel MOS transistor N7. This n-channel MOS transistor N7 may be of a size (e.g., the gate width) smaller than the n-channel MOS transistor N1 for pull-down driving. In the present embodiment, the transistor N7 and the one-shot pulse generating circuit 130 perform control for speeding up the transition from the on-state to the off-state of the pull-up transistor P1 by setting the p-channel MOS transistor P5 in the on-state without immediately turning the p-channel MOS transistor P5 to the on-state.

More specifically, the one-shot pulse generating circuit 130 according to the present embodiment generates a one-shot pulse, during transition from a high level to a low level of the enable signal EN, to perform control to turn on the n-channel MOS transistor N7 transiently to discharge the electrical charges of the pad 110 to set the voltage of the pad to the ground potential. If, when the value of the enable signal EN has been changed from the enable state (high level) to the disable state (low level), the pad 110 is at a high voltage, the voltage of the same level as the high voltage of the pad 110 is applied to a gate node TGC of the p-channel MOS transistor P5, composing the transmission gate, to turn off the p-channel MOS transistor P5. If conversely the n-channel MOS transistor N7 is turned on and the voltage of the pad 110 is set to a low voltage, a high voltage is not applied to the gate node TGC of the p-channel MOS transistor P5. Thus, during the fall transition of the enable signal EN, the p-channel MOS transistor P5 of the transmission gate is turned on, so that the high voltage of the node INP1 is transferred through the p-channel MOS transistor P5 of the transmission gate to the node INP2. That is, the time needed for complete turn-off of the p-channel MOS transistor P1 is shortened.

Figure 7:
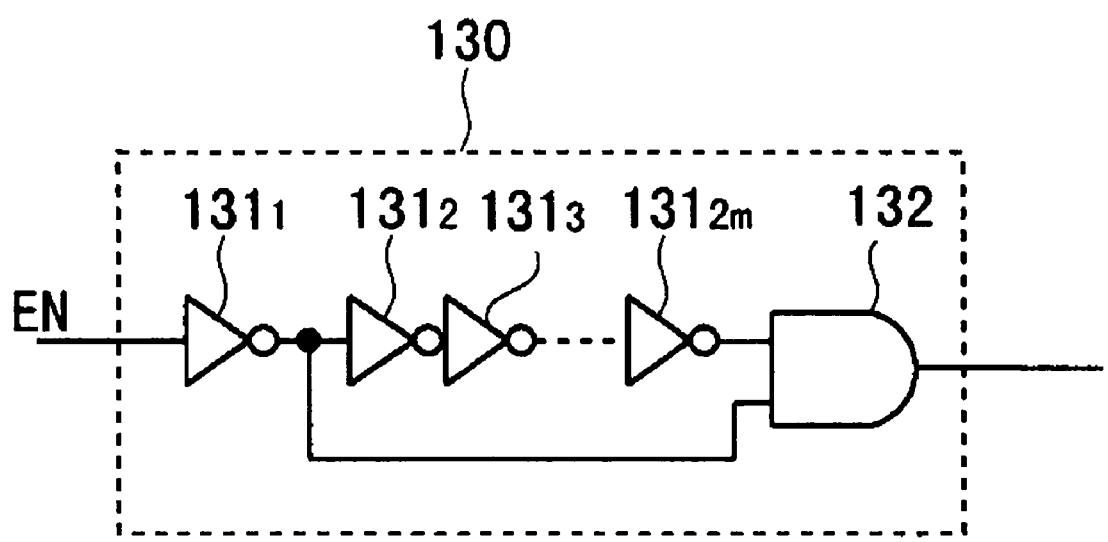
FIG. 7 shows the configuration of a one-shot circuit shown in FIG. 6.

FIG. 7 shows a configuration of the one-shot pulse generating circuit 130. This one-shot pulse generating circuit includes an AND circuit 132 which receives a signal obtained by inverting the signal EN inverted by an inverter 131, and a signal obtained by delaying the inverted signal of the signal EN by a delay circuit made up by an odd-number of inverters $131_2$ to $131_{2m}$ where m is a preset positive integer not less than 2. From an output terminal of the AND circuit 132 is output a one-shot pulse having a pulse width prescribed by the delay time of the delay circuit (odd-number stages of inverters $131_2$ to $131_{2m}$) and which rises in synchronization with the falling edge of the signal EN.

Figure 8:
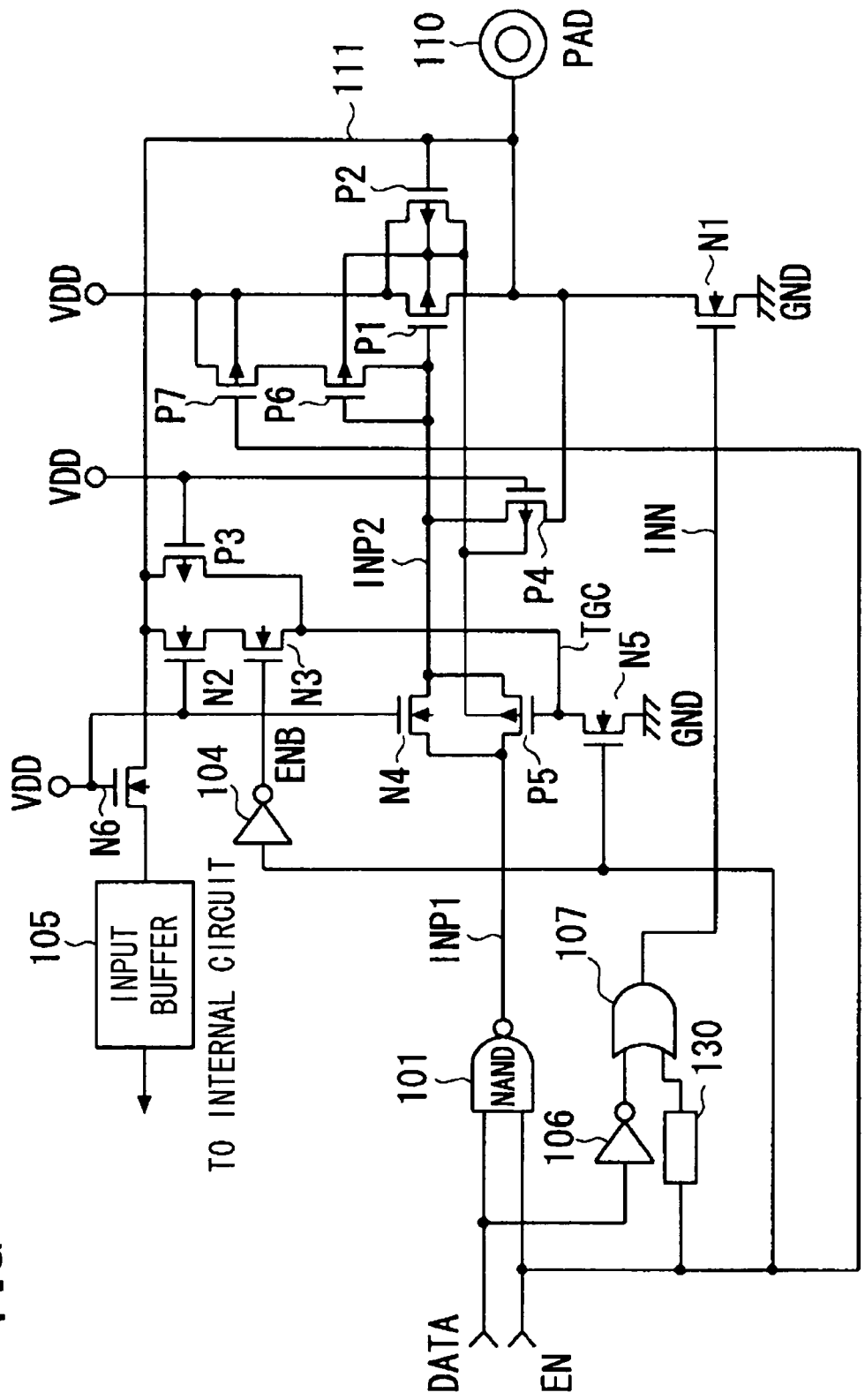
FIG. 8 shows the configuration of a sixth embodiment of the present invention.

A sixth embodiment of the present invention is now described. FIG. 8 shows the configuration of the sixth embodiment of the present invention. In FIG. 8, parts or components which are similar to those shown in FIG. 1 are indicated by the same reference numerals. Referring to FIG. 8, the present sixth embodiment of the present invention, similarly to the fifth embodiment, shown in FIG. 6, is devoid of the timing adjustment circuit 120 shown in FIG. 1 and is provided with the one-shot pulse generating circuit 130 and an OR circuit 107 in place of the NOR circuit 102 of the first embodiment. During transition from a high level to a low level of the enable signal EN, the one-shot pulse generating circuit 130 generates a one-shot pulse, and transiently turns on the n-channel MOS transistor N1 of the output stage to discharge the charges of the pad 110 to set the voltage to the ground potential. The one-shot pulse generating circuit 130 is configured as shown in FIG. 7.

In distinction from the fifth embodiment, shown in FIG. 6, in the present embodiment, the n-channel MOS transistor N7 and the n-channel MOS transistor N1 is replaced by the sole n-channel MOS transistor N1. The cascaded circuit (P6, P7), connected across the power supply VDD and the gate node INP2 of the p-channel MOS transistor P1 for pull-up driving, shown in FIG. 8, is the same as that of the first embodiment, shown in FIG. 1, and hence is not explained specifically.

Figure 14:
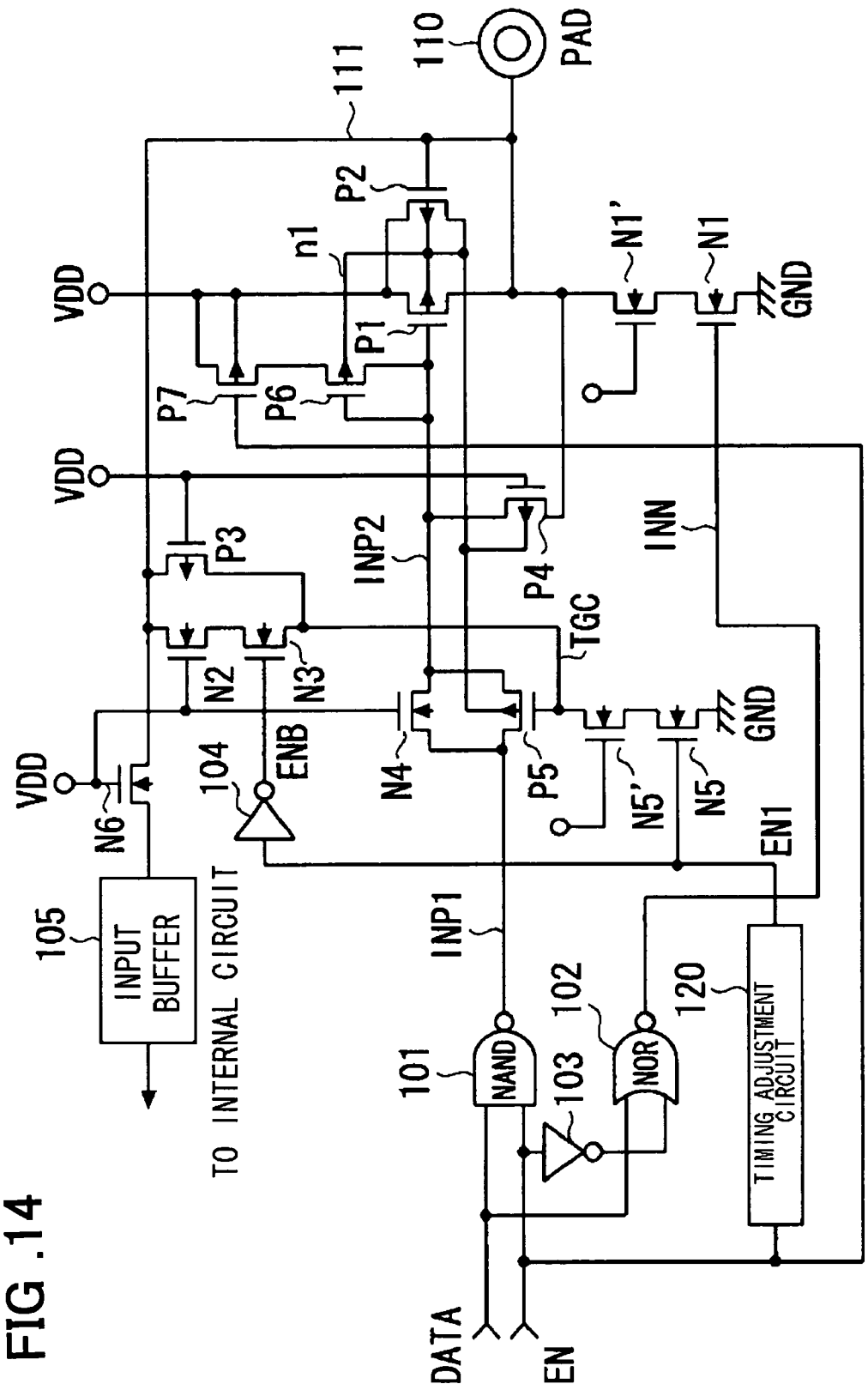
FIG. 14 shows a modification of the first embodiment.
Figure 15:
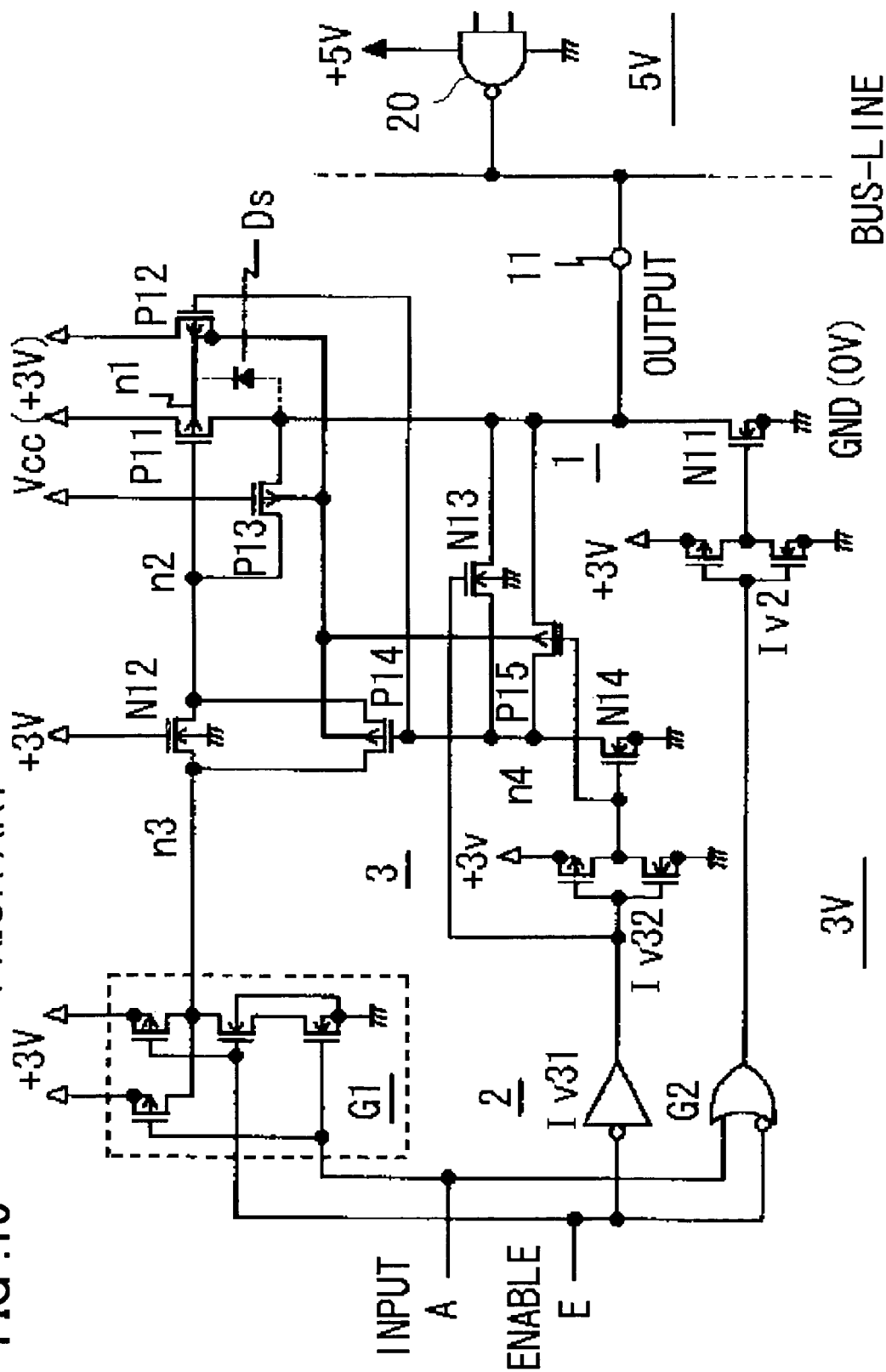
FIG. 15 shows the configuration of a conventional tolerant buffer circuit.

A modification of the first embodiment of the present invention, shown in FIG. 1, is now explained as a seventh embodiment. FIG. 14 shows the configuration of the seventh embodiment of the present invention. In FIG. 14, parts or components which are similar to those shown in FIG. 1 are indicated by the same reference numerals. Referring to FIG. 14, the present embodiment includes, in the configuration of the first embodiment, shown in FIG. 1, there is further provided an n-channel MOS transistor N5', which has a source connected to a drain of the n-channel MOS transistor N5, a drain connected to the gate of the p-channel MOS transistor P5 and a gate supplied with the power supply voltage VDD. The n-channel MOS transistor N5 has a source grounded and receives at its gate the control signal EN1 output from the timing adjustment circuit 120. It should be noted that the power supply voltage may be supplied to the gate of the N-channel MOS transistor N5' through a circuit element, in place of directly connecting the power from the power supply line, provided that the power supply voltage VDD is supplied to the gate of the N-channel MOS transistor N5'. The seventh embodiment of the present invention includes an N-channel MOS transistor N1', which has a drain connected to the pad 110, a source connected to the drain of the N-channel MOS transistor N1 and a gate supplied with the power supply voltage VDD. The n-channel MOS transistors N1' and N5' are designed for withstanding the high voltage applied to for example the pad 110. Similar structures may, of course, be used for the above-described respective embodiments.

In the above-described embodiments, shown in FIG. 1 etc, the n-channel MOS transistors N2 which has a gate biased by the power supply voltage VDD, may be omitted, and the n-channel MOS transistor N3 which has a gate supplied with an inverted signal of the control signal EN1, may be connected across the signal line 111 of the pad 110 and the gate node TGC of the p-channel MOS transistor P5 of the transmission gate.

A tolerant buffer circuit, devoid of both the timing adjustment circuit 120 and the cascaded circuit of n-channel MOS transistors connected across the power supply voltage VDD and the gate node INP2 of the p-channel MOS transistor P1 for pull-up driving, as a comparative example, and several embodiments of the present invention, are compared to each other in the following as to the circuit operation, based on the results of circuit simulation.

Figure 9:
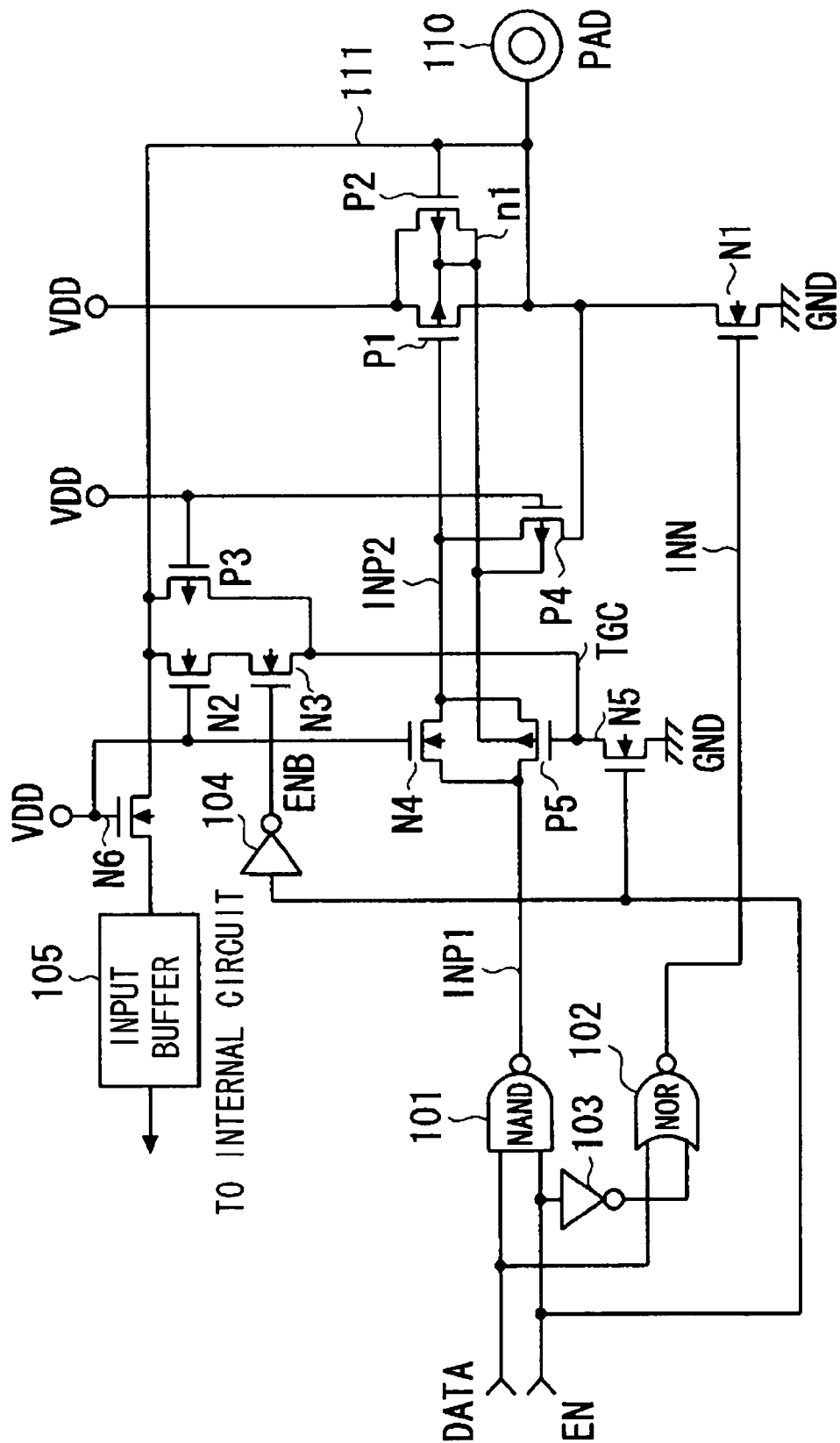
FIG. 9 shows the configuration of a comparative example.

FIG. 9 shows the configuration of the comparative example, which is the tolerant buffer circuit configured by omitting the timing adjustment circuit 120 and the cascaded circuit of p-channel MOS transistors P6 and P7 from the configuration of the present embodiment, shown in FIG. 1. In FIG. 9, parts or components which are similar to those shown in FIG. 1 are indicated by the same reference numerals.

Figure 10:
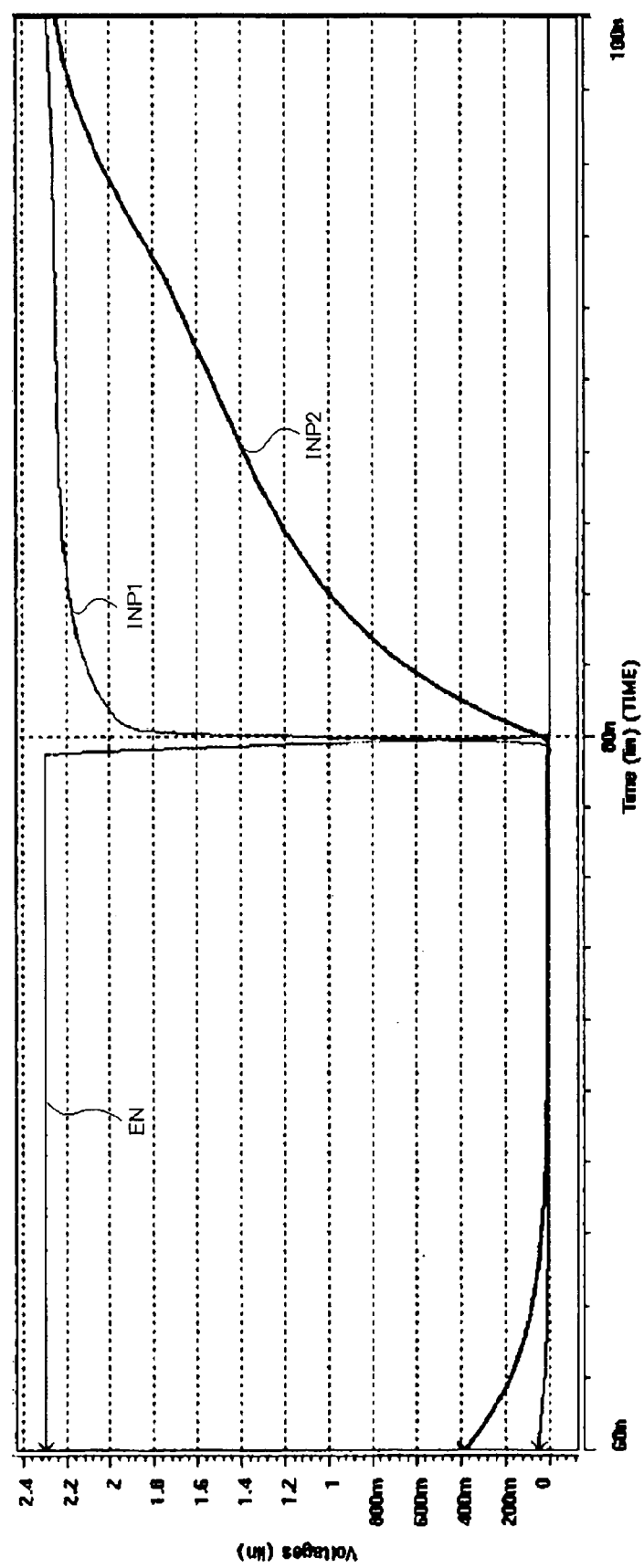
FIG. 10 shows an example of an operating waveform of a comparative example.

FIG. 10 shows signal waveforms of the signal EN and signals in the node INP1 and the node INP2, in changing over from the enable state to the disable state of the circuit shown in FIG. 9. That is, FIG. 10 shows the voltage waveforms of the signal EN, the node INP1 and the node INP2, obtained by a transient analysis of the transition from a high level to a low level of the signal EN, in the circuit shown in FIG. 9, with the amplitude of the signal EN being 2.3 V. The unit in the x-axis is 2 ns.

In the comparative example, the node INP2 rises slowly, at the time of fall of the enable signal EN, as shown in FIG. 10. In this case, the p-channel MOS transistor P1 is not turned off completely. That is, if, after the p-channel MOS transistor P1 is turned on and a high level is output to the pad 110, in the output mode (enable state), the enable signal EN is changed over to the disable state (low level), the p-channel MOS transistor P5 is turned off and only the n-channel MOS transistor N4 is turned on, in the transmission gate, and hence the voltage of the output node INP1 of the NAND circuit 101 (high level), which voltage rises quickly to a high level, is not transferred sufficiently to the node INP2, thereby setting the node INP2 at an intermediate voltage. That is, the voltage level of the power supply voltage Vdd minus Vth, where Vth is the threshold voltage of the n-channel MOS transistor N4, is output to the node INP2 connected to the n-channel MOS transistor N4. Thus, the p-channel MOS transistor P1 is not turned off at all, or certain time must elapse before it is turned off.

Figure 11:
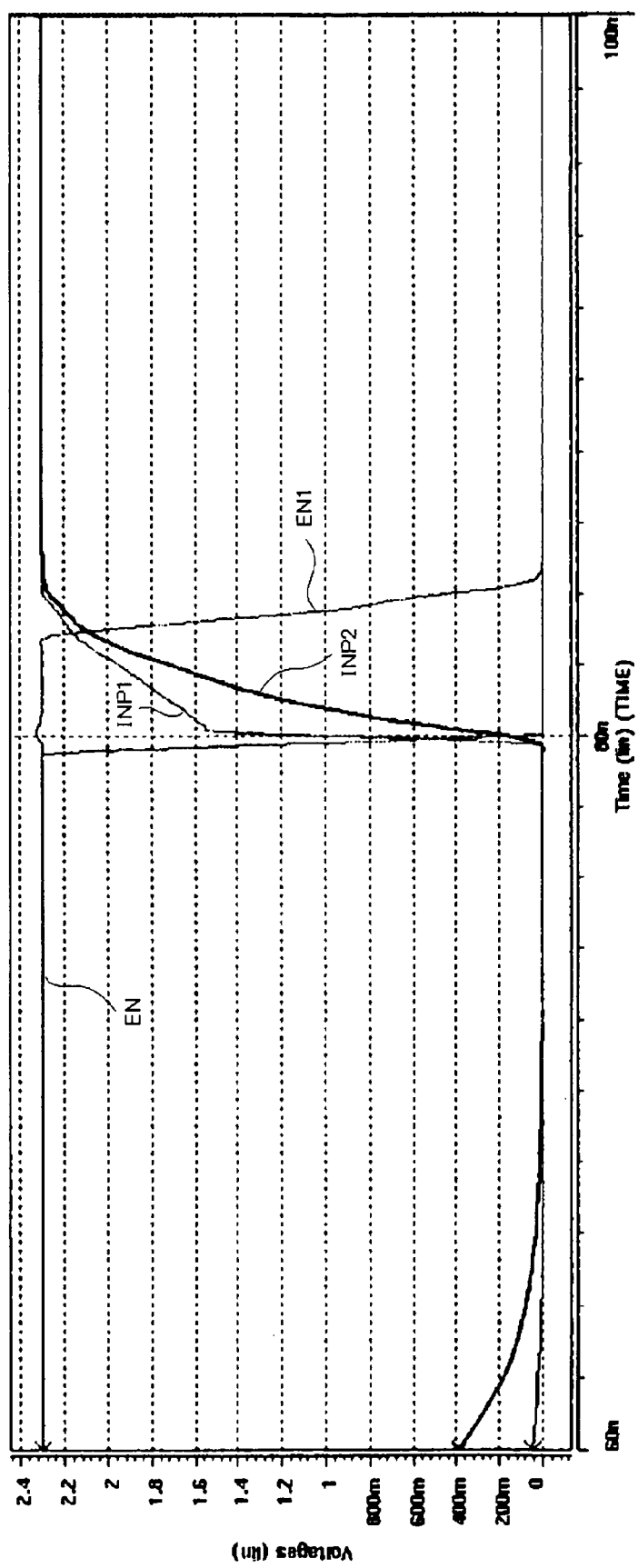
FIG. 11 shows an example of an operating waveform of a first embodiment.

FIG. 11 shows the voltage waveforms of the signals EN and EN1 and the voltages of the node INP1 and the nodes INP2, obtained on transient analysis of the transition from a high level to a low level of the signal EN, in the circuit shown in FIG. 1, with the amplitude of the signal EN being 2.3 V. The unit of the x-axis is 2 ns. In FIG. 11 and in FIGS. 12 and 13, explained subsequently, the scales of the ordinate and the abscissa are the same as in FIG. 10.

The signal EN1, which has delayed the falling edge of the enable signal EN, is kept in a high level for approximately 4 ns even after the enable signal EN goes low. During this time interval, the p-channel MOS transistor P5 of the transmission gate is turned on, as a result of which the node INP2 rises speedily (with the rise time being approximately 3 ns). The rise time of the node INP2 in the comparative example shown in FIG. 10 is 16 to 18 ns. The present embodiment shortens the rise time of the node INP2 to approximately one-fifth or less as compared with the comparative example.

Figure 12:
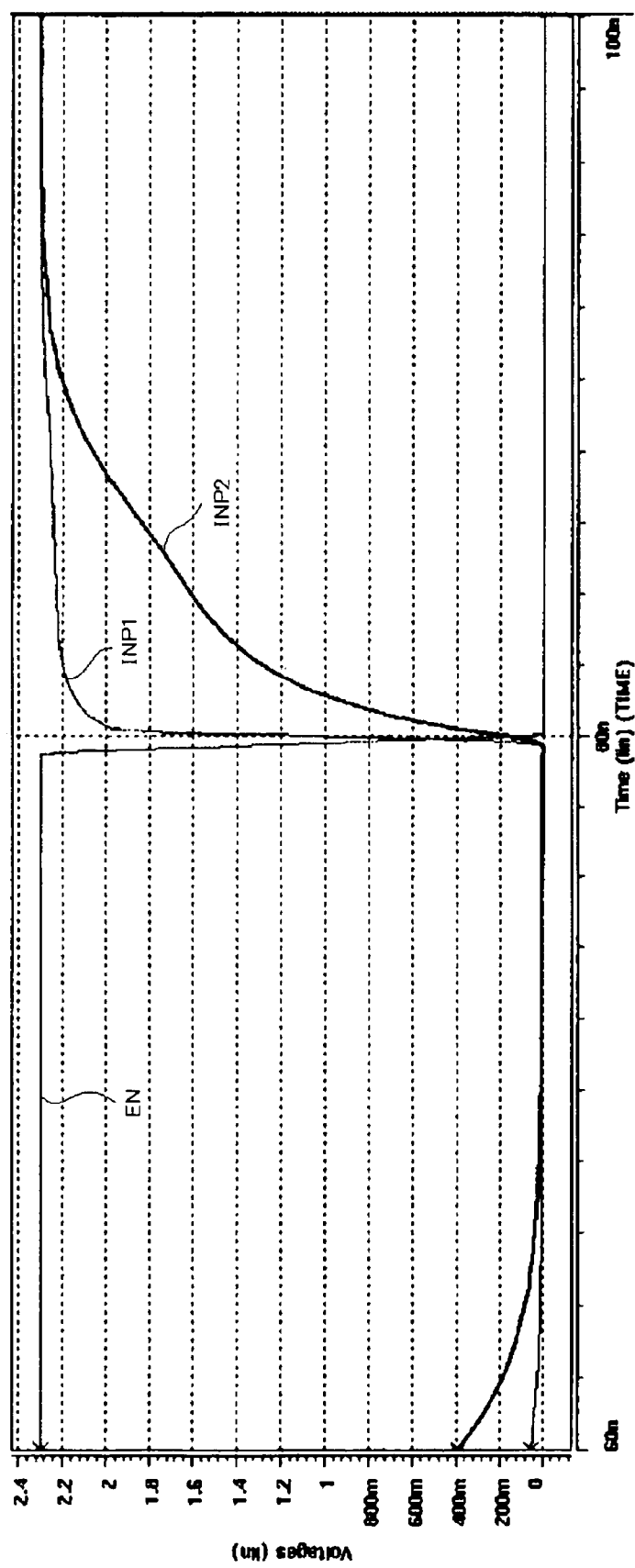
FIG. 12 shows an example of an operating waveform of a second embodiment.

FIG. 12 shows the voltage waveforms of the signal EN and the nodes INP1 and INP2 (results of the transient analysis) when switching from the enable state to the disable state of the circuit of the second embodiment shown in FIG. 3 (not having the timing adjustment circuit 120 and having the cascaded transistor circuit P6, P7).

Referring to FIG. 12, the rise time of the node INP2 in the configuration of the second embodiment shown in FIG. 3 is on the order of 8 ns to 9 ns, so that it is reduced to about one half that of the comparative example shown in FIG. 10. Thus, it may be seen that, with the present embodiment, the speedup of the switching from the on-state to the off-state of the pull-up transistor of the output stage is achieved.

Figure 13:
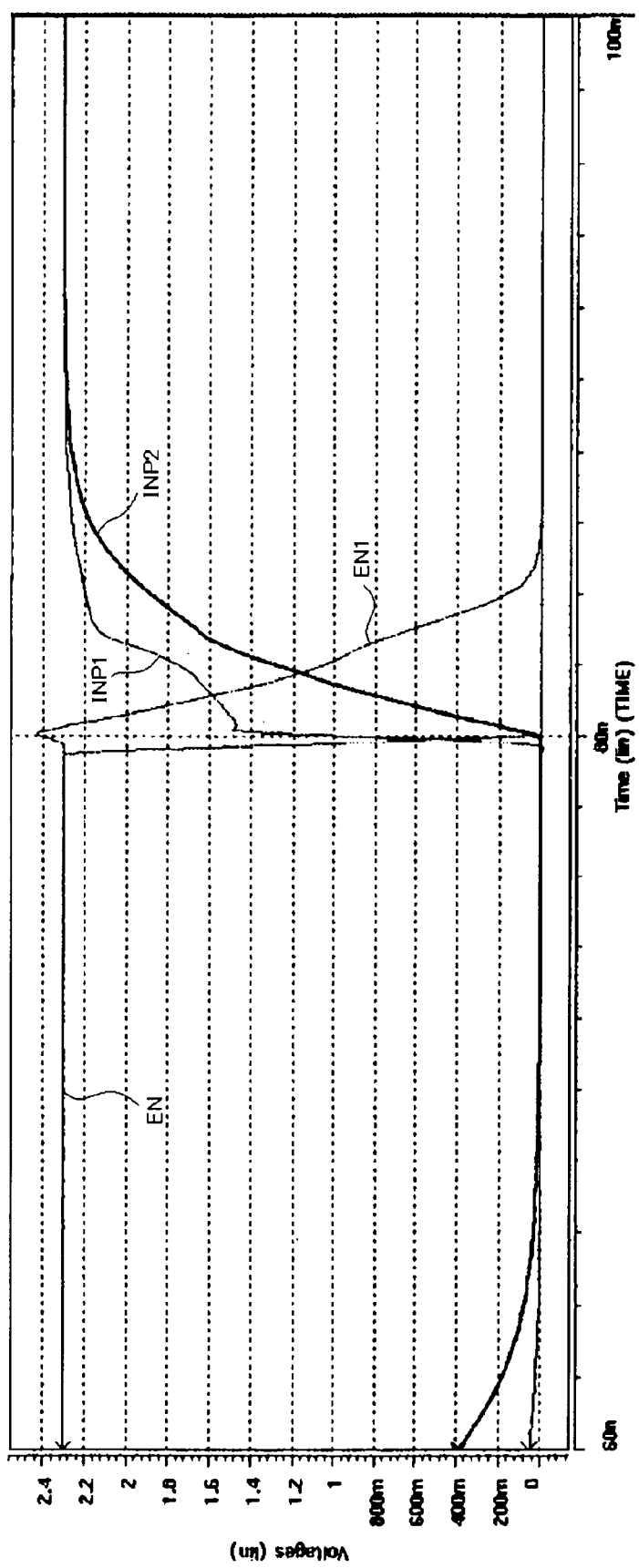
FIG. 13 shows an example of an operating waveform of a modification of the first embodiment.

FIG. 13 shows a structure corresponding to the configuration shown in FIG. 1, from which the cascaded transistor circuit P6 and P7 are removed and the gate length L of the n-channel MOS transistor of the output stage buffer of the buffer of the timing adjustment circuit 120 (see FIG. 2A) is relatively reduced to increase the fall time from a high level to a low level of the signal EN (modification of the first embodiment).

In the embodiment shown in FIG. 13, the rise time of the node INP2 is on the order of 6 ns, which is about one-third of that of the comparative example of FIG. 10. Thus, it may be seen that, with the present embodiment, the speedup of the switching from the on-state to the off-state of the pull-up transistor of the output stage is achieved.

In the above-described embodiments, an I/O cell, in which the input buffer circuit and the tristate buffer circuit are connected to a common I/O pad (I/O pin), the present invention may also be applied to a structure comprising only a tristate output buffer connected to an output pin (output pad).

While the invention has been described with reference to certain preferred embodiments, the present invention is not limited to the above-described embodiments, but various modification or corrections may, of course, be implemented without departing from the scope and the spirit of the invention as set forth and defined in the appended claims.

The meritorious effects of the present invention are summarized as follows.

As described above, the present invention has such a meritorious effect that, during the time of switching from the output enable state to the disable state of setting the output to a high impedance state, the time until complete turn-off of the transistor for pull-up driving is shortened to achieve a high-speed operation of the system having the mixed voltage circuit.

Additionally, the present invention has such a meritorious effect that, when the output enable state is changed over to the disable state providing a high impedance state, the counterpart device, connected to the buffer, is in a dwell state until the pull-up driving transistor of the buffer output state is completely turned off, such that, as from this time, the bus protocol for data outputting is unneeded, thereby realizing a high-speed bus system.

Moreover, the present invention has such a meritorious effect that, when the output enable state is changed over to the disable state providing a high impedance state, the transistor for pull-up driving is instantly turned off, so that no current from the power supply flows through e.g., a pull-down element connected to the pad through the pull-up driving transistor in the on-state, thus achieving low power consumption.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor device comprising:
   a tristate buffer circuit comprising, on an output stage, a first transistor for pull-up driving and a second transistor for pull-down driving, in which, when a control signal is of a value indicating an enable state, an output is set to a high level or to a low level, depending on a data signal, and in which, when the control signal is of a value indicating a disable state, said first and second transistors are both turned off to set the output in a high impedance state;
   a control circuit for performing control to speed up the transition from an on-state to an off-state of said first transistor when said control signal is switched from said enable state to said disable states;
   a logic circuit for receiving said data signal and said control signal as inputs and outputting a first signal for controlling the on/off state of said first transistor; and
   a transmission gate comprising a third transistor, said third transistor being turned on when said control signal is of a value indicating the enable state and receiving said first signal output from said logic circuit to transfer said first signal to a control terminal of said first transistor, said third transistor being turned off when said control signal is of the value indicating the disable state, wherein;
   said control circuit comprises a circuit for receiving said control signal and delaying the timing of changing over the state of said third transistor of said transmission gate from an on-state to an off-state at the time of switching the state of said control signal from the enable state to the disable state; and
   during the time said third transistor is on, when the state of said control signal is switched from the enable state to the disable state, said transmission gate transfers the level of said first signal output from said logic circuit for turning off said first transistor to a control terminal of said first transistor to speed up the transition from the on-state to the off-state of said first transistor.

2. The semiconductor device as defined in claim 1, wherein said control circuit comprises a circuit which, when said control signal is of a value indicating the enable state, and a signal determining the on/off state of said first transistor is of a level indicating the on-state of said first transistor, performs control to shorten the time until said signal determining the on/off state of said first transistor gets to a level turning off said first transistor at the time of switching of said control signal from said enable state to said disable state.

3. The semiconductor device as defined in claim 1, wherein said control circuit comprises a circuit for rendering a path across the control terminal of said first transistor and the power supply electrically conductive responsive to said control signal to set the control terminal of said first transistor to a voltage which turns off said first transistor.

4. The semiconductor device as defined in claim 1, further comprising:
   a fourth transistor between a pad comprising an output of said tristate buffer circuit and an output of said second transistor, and having a control terminal supplied with the power supply potential.

5. The semiconductor device as defined in claim 1, further comprising:
   a pad comprising an output of said tristate buffer circuit;
   wherein said control circuit comprises a circuit for receiving a signal reflecting the voltage of said pad and said control signal to perform control to cause said third transistor, comprising said transmission gate, to be transiently turned on, during transition from said enable state to the disable state of said control signal, when said signal reflecting the pad voltage indicates a high level voltage.

6. The semiconductor device as defined in claim 1, further comprising:
   a pad connected to an output of said tristate buffer circuit; and
   an input buffer connected to said pad; wherein:
   said tristate buffer circuit, said pad and said input buffer comprise an I/O buffer circuit which is set to an output mode of outputting a level corresponding to said data signal from said tristate buffer circuit to said pad when said control signal is of a value indicating the enable state; and
   said I/O buffer circuit is set to an input mode of receiving a signal applied to said pad by said input buffer when said control signal is of a value indicating the disable state.

7. The semiconductor device as defined in claim 6, further comprising:
   a circuit connected across said pad and said input buffer for supplying a signal of the level of said power supply voltage to an input end of the input buffer when the voltage equal to or higher than the power supply voltage of said tristate buffer is applied to said pad.

8. A semiconductor device, comprising:
   a tristate buffer circuit comprising, on an output stage, a first transistor for pull-up driving and a second transistor for pull-down driving, in which, when a control signal is of a value indicating an enable state, an output is set to a high level or to a low level, depending on a data signal, and in which, when the control signal is of a value indicating a disable state, said first and second transistors are both turned off to set the output in a high impedance state;
   a control circuit for performing control to speed up the transition from an on-state to an off-state of said first transistor when said control signal is switched from said enable state to said disable state;
   a first logic circuit for receiving said data signal and said control signal as inputs and for outputting a first signal controlling the on/off state of said first transistor; and a transmission gate connected across an output terminal of said first logic circuit and the control terminal of said first transistor; wherein:

said first logic circuit outputs a second logic value as said first signal, when said control signal indicates the enable state and said data signal is of a first logic value, and outputs the first logic value, as said first signal, without dependency on the value of said data signal, when said control signal is of a value indicating the disable state;

said first transistor is turned on and off when the control terminal of said first transistor is of the second logic value and of the first logic value, respectively;

said transmission gate comprises a third transistor controlled to be on when said control signal is in the enable state;

said control circuit comprises a timing adjustment circuit for receiving said control signal and delaying the transition timing from the enable state to the disable state of said control signal to output the delayed signal as a second control signal; and said third transistor is changed over from an on-state to an off-state based on transition from the enable state to the disable state of said second control signal output from said timing adjustment circuit.

9. The semiconductor device as defined in claim 8, wherein said timing adjustment circuit comprises a delay circuit for receiving and delaying said control signal a preset time to output the delayed signal.

10. The semiconductor device as defined in claim 8, wherein said timing adjustment circuit comprises:
a delay circuit for receiving said control signal and delaying the control signal a preset time to output the delayed signal; and
a second logic circuit for receiving said control signal and an output signal of said delay circuit and delaying for a preset time the transition from the enable state to the disable state of said control signal to output the delayed signal as said second control signal.

11. The semiconductor device as defined in claim 8, wherein said control circuit further comprises a further circuit connected across the control terminal of said first transistor and the power supply; wherein:
said further circuit, when said control signal is of a value indicating the enable state, renders a path between said power supply and a control terminal node of said first transistor to an electrically non-conductive state; and
said further circuit, when said control signal is of a value indicating the disable state, renders the path between said power supply and a control terminal node of said first transistor to an electrically conductive state to set the voltage of the control terminal of said first transistor to a level turning off said first transistor.

12. The semiconductor device as defined in claim 8, further comprising:
a pad comprising an output of said tristate buffer circuit;
a fourth transistor having a control terminal supplied with the power supply potential and comprising said transmission gate, said fourth transistor being of a second conductivity type, opposite to a first conductivity type of said third transistor which is turned on when said second control signal from said timing adjustment circuit is of a value indicating the enable state;
a series circuit comprising a fifth transistor of the second conductivity type, and having a control gate supplied with the power supply potential, and a sixth transistor of the second conductivity type, controlled to an off-state and to an on-state when said second control signal from said timing adjustment circuit is of a value indicating the enable state and of a value indicating the disable state, respectively, said series circuit connected between the control terminal of said third transistor and said pad; and
a seventh transistor of the first conductivity type having a control terminal supplied with the power supply potential, between the control terminal of said third transistor and said pad, in parallel with said series circuit.

13. The semiconductor device as defined in claim 8, further comprising:
a pad comprising an output of said tristate buffer circuit;
a fourth transistor having a control terminal supplied with the power supply potential, and comprising said transmission gate, said fourth transistor being of a second conductivity type, opposite to a first conductivity type of said third transistor which is turned on when said second control signal from said timing adjustment circuit is of a value indicating the enable state;
a fifth transistor of the second conductivity type, between the control terminal of said third transistor and said pad, said fifth transistor being controlled to be off and on when said second control signal from said timing adjustment circuit is of a value indicating the enable state and the disable state, respectively;
a sixth transistor of the first conductivity type having a control terminal supplied with the power supply potential and connected between the control terminal of said third transistor and said pad, in parallel with said fifth transistor.

14. The semiconductor device as defined in claim 8, further comprising:
a pad connected to an output node of said first transistor and comprising an output of said tristate buffer circuit; and
a fourth transistor provided in a well region common to the well region of said first transistor or in a well region connected to the well region of said first transistor, said fourth transistor having a control terminal connected to said pad and being of the same conductivity type as said first transistor; wherein:
the third transistor, comprising said transmission gate, is arranged in a well region common to a well region of said first transistor and/or said fourth transistor or in a well region connected to the well regions of said first transistor and said fourth transistor; and
wherein electric connection between said well region associated with said first, third and fourth transistors and the power supply are controlled to be in an off-state through said fourth transistor when the voltage of said pad is equal to or higher than the power supply voltage of said tristate buffer circuit.

15. The semiconductor device as defined in claim 8, further comprising:
a fourth transistor between the control terminal of said third transistor of said transmission gate and a second power supply, said fourth transistor having a control terminal supplied with said second control signal output from said timing adjustment circuit and being turned on and off when said second control signal is of a value indicating the enable state and the disable state, respectively.

16. The semiconductor device as defined in claim 15, further comprising
a fifth transistor connected across the control terminal of said third transistor of said transmission gate and an output node of said fourth transistor and having a control terminal supplied with the power supply potential.

17. The semiconductor device as defined in claim 8, further comprising:
a one-shot pulse generating circuit for receiving said control signal and detecting the switching from the enable state to the disable state of said control signal to generate a one-shot pulse signal of a preset pulse width; and
a fourth transistor connected across an output node of said tristate buffer circuit and a second power supply for receiving an output signal of said one-shot pulse generating circuit, said fourth transistor being turned on during a period determined by the pulse width of said one-shot pulse signal.

18. The semiconductor device as defined in claim 8, further comprising:
a pad comprising an output of said tristate buffer circuit;
wherein said timing adjustment circuit receives a signal reflecting the voltage of said pad and said control signal to perform control to cause said third transistor, comprising said transmission gate, to be transiently turned on, during transition from said enable state to the disable state of said control signal, when said signal reflecting the pad voltage indicates a high level voltage.

19. The semiconductor device as defined in claim 11, wherein:
said control circuit comprises at least two transistors connected in series across the control terminal of said first transistor and said power supply;
one of said two transistors is connected in a diode configuration;
the other of said two transistors has a control terminal supplied with said control signal and is turned off and on when said control signal is of a value indicating the enable state and the disable state, respectively.

20. A semiconductor device, comprising:
a tristate buffer circuit comprising, on an output stage, a first transistor for pull-up driving and a second transistor for pull-down driving, in which, when a control signal is of a value indicating an enable state, an output is set to a high level or to a low level, depending on a data signal, and in which, when the control signal is of a value indicating a disable state, said first and second transistors are both turned off to set the output in a high impedance state;
a control circuit for performing control to speed up the transition from an on-state to an off-state of said first transistor when said control signal is switched from said enable state to said disable state;
a first logic circuit for receiving said data signal and said control signal as inputs and outputting a first signal controlling the on/off state of said first transistor; and
a transmission gate connected across an output terminal of said first logic circuit and the control terminal of said first transistor; wherein:
said first logic circuit outputs a second logic value as said first signal, when said control signal indicates the enable state and said data signal is of a first logic value, and outputs the first logic value, as said first signal, without dependency on the value of said data signal, when said control signal is of a value indicating the disable state;
said first transistor is turned on and off when the control terminal of said first transistor is of the second logic value and of the first logic value, respectively;
said transmission gate comprises a third transistor controlled to be on when said control signal is in the enable state;
said control circuit comprises a further circuit connected across the control terminal of said first transistor and the power supply, said further circuit, when said control signal is of a value indicating the enable state, rendering a path between said power supply and a control terminal node of said first transistor to an electrically non-conductive state; said further circuit, when said control signal is of a value indicating the disable state, rendering the path between said power supply and the control terminal node of said first transistor to an electrically conductive state to set the voltage of the control terminal of said first transistor to a level turning off said first transistor.

21. The semiconductor device as defined in claim 20, further comprising
a fourth transistor between the control terminal of said third transistor of said transmission gate and a second power supply, said fourth transistor having a control terminal supplied with said control signal and being turned on and off when said control signal is of a value indicating the enable state and the disable state, respectively.

22. The semiconductor device as defined in claim 20, wherein said control circuit comprises at least two transistors connected in series across the control terminal of said first transistor and said power supply; wherein:
one of said two transistors is connected in a diode configuration;
the other of said two transistors has a control terminal supplied with said control signal and being turned off and on when said control signal is of a value indicating the enable state and the disable state, respectively.

23. The semiconductor device as defined in claim 22, further comprising
a pad connected to an output of said tristate buffer circuit; wherein:
one of said two transistors of said control circuit is provided in a well region common to the well region of said first transistor and/or the well region of said third transistor or in said well regions of said first transistor and said third transistor; and
an electric connection between the power supply and said well regions of said first and third transistors and the one of said two transistors of said control circuit is controlled to be in an off-state through said third transistor when the voltage of said pad is equal to or higher than the power supply voltage of said tristate buffer circuit.

24. The semiconductor device as defined in claim 20, further comprising:
a pad comprising an output of said tristate buffer circuit;
wherein said control circuit comprises a circuit receiving a signal reflecting the voltage of said pad and said control signal to perform control to cause said third transistor, comprising said transmission gate, to be transiently turned on, during transition from said enable state to the disable state of said control signal, when said signal reflecting the pad voltage indicates a high level voltage.

25. The semiconductor device as defined in claim 20, wherein said control circuit comprises a timing adjustment circuit for receiving said control signal and delaying the transition timing from the enable state to the disable state of said control signal to output the delayed signal as a second control signal.

26. The semiconductor device as defined in claim 25 further comprising:
a pad comprising an output of said tristate buffer circuit;
a fourth transistor having a control terminal supplied with the power supply potential, and comprising said transmission gate, said fourth transistor being of a second conductivity type, opposite to a first conductivity type of said third transistor which is turned on when said second control signal from said timing adjustment circuit is of a value indicating the enable state;
a series circuit comprising a fifth transistor of the second conductivity type, having a control gate supplied with the power supply potential, and a sixth transistor of the second conductivity type, controlled to an off-state and to an on-state when said second control signal from said timing adjustment circuit is of a value indicating the enable state and of a value indicating the disable state, respectively, said series circuit connected between the control terminal of said third transistor and said pad; and
a seventh transistor of the first conductivity type having a control terminal supplied with the power supply potential, between the control terminal of said third transistor and said pad, in parallel with said series circuit.

27. The semiconductor device as defined in claim 25, further comprising:
a pad comprising an output of said tristate buffer circuit;
a fourth transistor having a control terminal supplied with the power supply potential, and comprising said transmission gate, said fourth transistor being of a second conductivity type, opposite to a first conductivity type of said third transistor which is turned on when said second control signal from said timing adjustment circuit is of a value indicating the enable state;
a fifth transistor of the second conductivity type, between the control terminal of said third transistor and said pad, said fifth transistor being controlled to be off and on when said second control signal from said timing adjustment circuit is of a value indicating the enable state and the disable state, respectively;
a sixth transistor of the first conductivity type having a control terminal supplied with the power supply potential and connected between the control terminal of said third transistor and said pad, in parallel with said fifth transistor.

28. A semiconductor device, comprising:
a tristate buffer circuit comprising, on an output stage, a first transistor for pull-up driving and a second transistor for pull-down driving, in which, when a control signal is of a value indicating an enable state, an output is set to a high level or to a low level, depending on a data signal, and in which, when the control signal is of a value indicating a disable state, said first and second transistors are both turned off to set the output in a high impedance state;
a control circuit for performing control to speed up the transition from an on-state to an off-state of said first transistor when said control signal is switched from said enable state to said disable state;
a logic circuit for receiving said control signal and said data signal as inputs and outputting a further signal controlling the on/off state of said second transistor; an output terminal of said logic circuit being connected to a control circuit of said second transistor; wherein:
said logic circuit, when said control signal indicates an enable state and said data signal assumes first and second logic values, outputs, as said further signal, an output signal causing said second transistor to be turned off and on, respectively; and
said logic circuit, when said control signal indicates a disable state, outputs an output signal causing said second transistor to be turned off, as said further signal, without dependency on said data signal.

29. A semiconductor device, comprising:
a tristate buffer circuit comprising, on an output stage, a first transistor for pull-up driving and a second transistor for pull-down driving, in which, when a control signal is of a value indicating an enable state, an output is set to a high level or to a low level, depending on a data signal, and in which, when the control signal is of a value indicating a disable state, said first and second transistors are both turned off to set the output in a high impedance state;
a control circuit for performing control to speed up the transition from an on-state to an off-state of said first transistor when said control signal is switched from said enable state to said disable state;
a pad connected to an output node of said first transistor and comprising an output of said tristate buffer circuit; and
a bypass circuit connected across the control terminal of said first transistor and the output node of said first transistor for forming a bypass across the output node of said first transistor and said control terminal of said first transistor, when the voltage applied to said pad is equal to or higher than the power supply voltage of said tristate buffer.

30. A semiconductor device, comprising:
a tristate buffer circuit comprising, on an output stage, a first transistor for pull-up driving and a second transistor for pull-down driving, in which, when a control signal is of a value indicating an enable state, an output is set to a high level or to a low level, depending on a data signal, and in which, when the control signal is of a value indicating a disable state, said first and second transistors are both turned off to set the output in a high impedance state;
a control circuit for performing control to speed up the transition from an on-state to an off-state of said first transistor when said control signal is switched from said enable state to said disable state;
a pad connected to an output node of said first transistor and comprising an output of said tristate buffer circuit; and
a third transistor provided in a well region common to the well region of said first transistor or in a well region connected to the well region of said first transistor, said third transistor being of the same conductivity type as said first transistor and having a control terminal connected to said pad;
wherein electric connection between said well region and the power supply is controlled to be in an off-state through said third transistor when the voltage of said pad is equal to or higher than the power supply voltage of said tristate buffer circuit.

31. The semiconductor device as defined in claim 30, further comprising:
a fourth transistor of the same conductivity type as said first transistor, having the control terminal supplied with the power supply potential and connected across the control terminal and an output node of said first transistor; said fourth transistor being provided in a well region common to the well region of said first transistor and/or said third transistor or in a well region connected to the well region of said first transistor and said third transistor;

wherein electric connection between said well region associated with said fourth transistor and the power supply is controlled to be in an off-state through said third transistor when the voltage of said pad is equal to or higher than the power supply voltage of said tristate buffer circuit.

32. A semiconductor device, comprising:

a tristate buffer circuit comprising, on an output stage, a first transistor for pull-up driving and a second transistor for pull-down driving, in which, when a control signal is of a value indicating an enable state, an output is set to a high level or to a low level, depending on a data signal, and in which, when the control signal is of a value indicating a disable state, said first and second transistors are both turned off to set the output in a high impedance state;

a control circuit for performing control to speed up the transition from an on-state to an off-state of said first transistor when said control signal is switched from said enable state to said disable state;

a one-shot pulse generating circuit for receiving said control signal and detecting the switching from the enable state to the disable state of said control signal to generate a one-shot pulse signal of a preset pulse width; and a logic circuit for receiving said data signal and an output signal of said one-shot pulse generating circuit to generate a signal which turns on said second transistor when said data signal is of a selected logic value or when said one-shot pulse signal is active.

33. A semiconductor device, comprising:

a tristate buffer circuit comprising, on an output stage, a first transistor for pull-up driving and a second transistor for pull-down driving, in which, when a control signal is of a value indicating an enable state, an output is set to a high level or to a low level, depending on a data signal, and in which, when the control signal is of a value indicating a disable state, said first and second transistors are both turned off to set the output in a high impedance state;

a control circuit for performing control to speed up the transition from an on-state to an off-state of said first transistor when said control signal is switched from said enable state to said disable state;

wherein said tristate buffer circuit comprises a tolerant buffer circuit capable of applying in a disable state a voltage higher than the power supply voltage of said tristate buffer circuit or than said driving power supply voltage.

* * * * *